US012571680B2

(12) United States Patent
    Yamanaka

(10) Patent No.:    US 12,571,680 B2
(45) Date of Patent:        Mar. 10, 2026

(54) WAVELENGTH MEASUREMENT APPARATUS, NARROWED-LINE LASER APPARATUS, AND METHOD FOR MANUFACTURING ELECTRONIC DEVICES

(71) Applicant: Gigaphoton Inc., Tochigi (JP)

(72) Inventor: Takuma Yamanaka, Oyama (JP)

(73) Assignee: Gigaphoton Inc., Tochigi (JP)

( * ) Notice:    Subject to any disclaimer, the term of this patent is extended or adjusted under 35 U.S.C. 154(b) by 148 days.

(21) Appl. No.: 18/487,774

(22) Filed:    Oct. 16, 2023

(65)                Prior Publication Data

US 2024/0044711 A1        Feb. 8, 2024

Related U.S. Application Data

(63) Continuation of application No. PCT/JP2021/020383, filed on May 28, 2021.

(51) Int. Cl.
     *H01S 3/08*          (2023.01)
     *G01J 3/00*          (2006.01)
                    (Continued)
(52) U.S. Cl.
     CPC ............ *G01J 3/45* (2013.01); *G03F 7/70025* (2013.01); *G03F 7/70575* (2013.01);
                    (Continued)
(58) Field of Classification Search
     CPC ...... G01J 3/26; G01J 3/027; G01J 3/43; G01J 3/46; H01S 3/137; H01S 3/08009;
                    (Continued)

(56)                References Cited

U.S. PATENT DOCUMENTS 4,897,843  A  *  1/1990  Scott ........................ H01S 3/137
                                                    372/12
4,927,269  A  *  5/1990  Keens ........................ G01J 3/45
                                                    356/451
                    (Continued)

FOREIGN PATENT DOCUMENTS

JP          H05-007031 A        1/1993
JP          H06-188502 A        7/1994
                    (Continued)

OTHER PUBLICATIONS

Machine translation of JP-2649378-B2 (Year: 1997).*
                    (Continued)

*Primary Examiner* — Steven H Whitesell
(74) *Attorney, Agent, or Firm* — Studebaker Brackett PLLC

(57)                ABSTRACT

A wavelength measurement apparatus includes a first spectrometer that has a first free spectral range and generates a first measured waveform from an interference pattern produced by a pulse laser beam, a second spectrometer that has a second free spectral range narrower than the first free spectral range and generates a second measured waveform from the interference pattern produced by the pulse laser beam, and a processor that reads data on a first measurement range of the first spectrometer, sets a second measurement range of the second spectrometer based on the data on the first measurement range, reads data on the second measurement range, and calculates a center wavelength of the pulse laser beam based on the data on the first measurement range and the data on the second measurement range.

9 Claims, 12 Drawing Sheets

(51) Int. Cl.

| | |
|---|---|
| *G01J 3/45* | (2006.01) |
| *G03F 7/00* | (2006.01) |
| *H01S 3/13* | (2006.01) |
| *H01S 3/137* | (2006.01) |

(52) U.S. Cl.
CPC ........ *H01S 3/08086* (2013.01); *H01S 3/1305* (2013.01); *H01S 3/137* (2013.01); *G01J 2003/003* (2013.01)

(58) Field of Classification Search
CPC .... H01S 3/225; H01S 3/08004; H01S 3/1062; G03F 7/70041
See application file for complete search history.

(56) References Cited

U.S. PATENT DOCUMENTS

| | | | |
|---|---|---|---|
| 4,947,398 A | * | 8/1990 | Yasuda ................... H01S 3/136 372/32 |
| 2002/0167975 A1 | | 11/2002 | Spangler et al. |
| 2012/0182555 A1 | | 7/2012 | Statz et al. |
| 2017/0222391 A1 | * | 8/2017 | Moriya ................. G01J 1/0425 |
| 2018/0254600 A1 | | 9/2018 | Kumazaki et al. |
| 2019/0033133 A1 | | 1/2019 | Moriya |
| 2021/0294223 A1 | | 9/2021 | Yamanaka et al. |

FOREIGN PATENT DOCUMENTS

| | | | |
|---|---|---|---|
| JP | 2649378 B2 | * | 9/1997 |
| JP | 2001298234 A | * | 10/2001 |
| JP | 2006-269631 A | | 10/2006 |
| JP | 2007005538 A | * | 1/2007 |
| WO | 2017098625 A1 | | 6/2017 |
| WO | 2020/157839 A1 | | 8/2020 |

OTHER PUBLICATIONS

Machine translation of JP-2001298234-A (Year: 2001).*
Machine translation of JP-2007005538-A (Year: 2007).*
International Search Report issued in PCT/JP2021/020383; mailed Jul. 13, 2021.
International Preliminary Report On Patentability issued in PCT/JP2021/020383; issued Nov. 21, 2023.

* cited by examiner

FIG. 1

*FIG. 3*
FIRST WAVELENGTH          SECOND WAVELENGTH
COARSE ETALON SPECTROMETER
FSRc = 500 pm
FSRf = 10 pm
FINE ETALON SPECTROMETER
*FIG. 4*
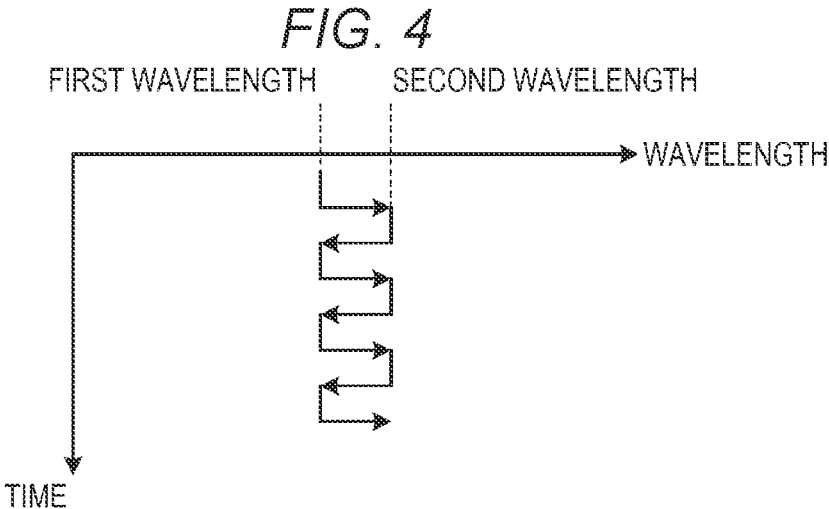
FIRST WAVELENGTH          SECOND WAVELENGTH
WAVELENGTH
TIME
*FIG. 5*
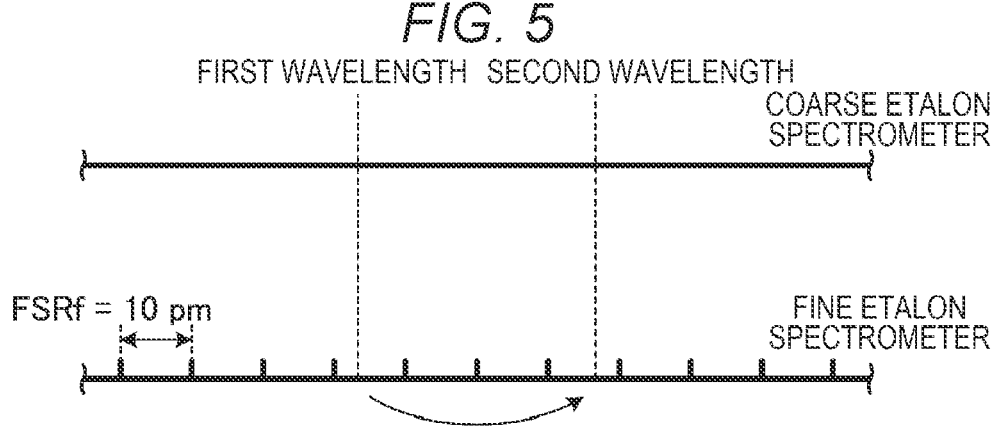
FIRST WAVELENGTH   SECOND WAVELENGTH
COARSE ETALON
SPECTROMETER
FSRf = 10 pm
FINE ETALON
SPECTROMETER

FIG. 6

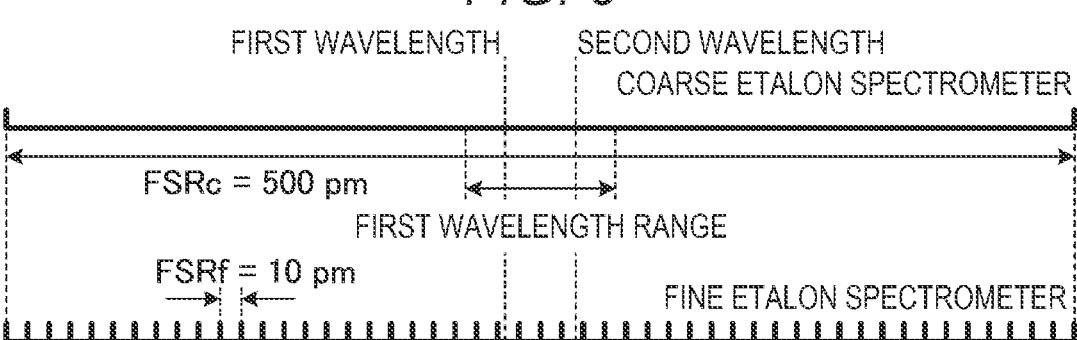

FIRST WAVELENGTH      SECOND WAVELENGTH

COARSE ETALON SPECTROMETER

FSRc = 500 pm

FIRST WAVELENGTH RANGE

FSRf = 10 pm

FINE ETALON SPECTROMETER

FIG. 7

FIRST WAVELENGTH      SECOND WAVELENGTH

→WAVELENGTH

TIME      FIRST WAVELENGTH RANGE

FIG. 8

FIRST WAVELENGTH      SECOND WAVELENGTH

COARSE ETALON
SPECTROMETER $WL_{C0}$

FIRST WAVELENGTH RANGE

FSRf = 10 pm

FINE ETALON
SPECTROMETER

SECOND      SECOND
WAVELENGTH RANGE WAVELENGTH RANGE

FIG. 11
PRE-OSCILLATION
COARSE ETALON SPECTROMETER
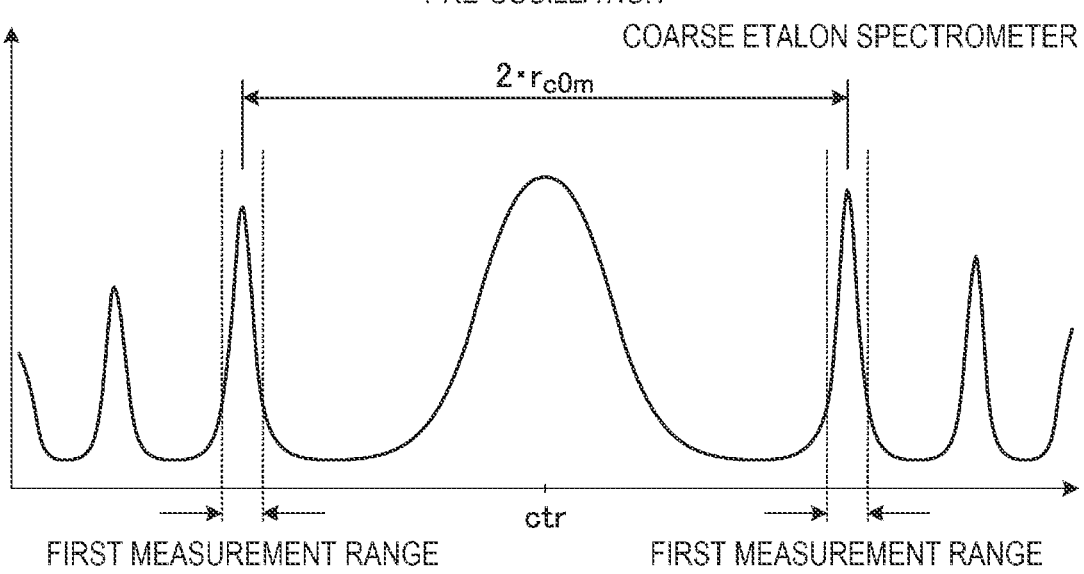
$2 \cdot r_{c0m}$
FIRST MEASUREMENT RANGE          ctr          FIRST MEASUREMENT RANGE
FIG. 12
PRE-OSCILLATION
FINE ETALON SPECTROMETER
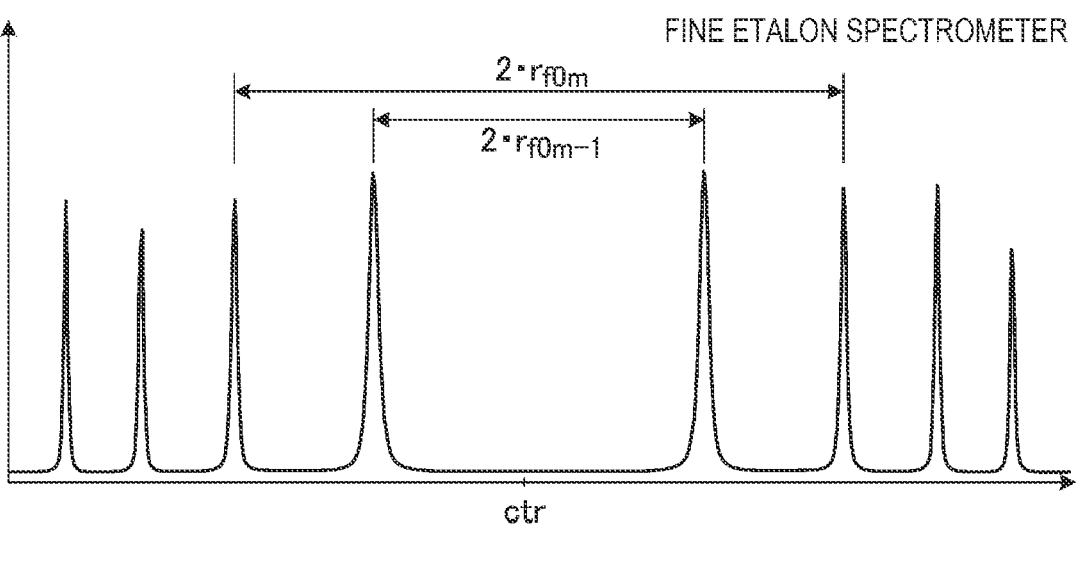
$2 \cdot r_{f0m}$
$2 \cdot r_{f0m-1}$
ctr
FIG. 13
Imax
$\dfrac{Imax}{2}$
$2 \cdot r_{in}$
$2 \cdot r_{out}$
ctr

FIG. 14

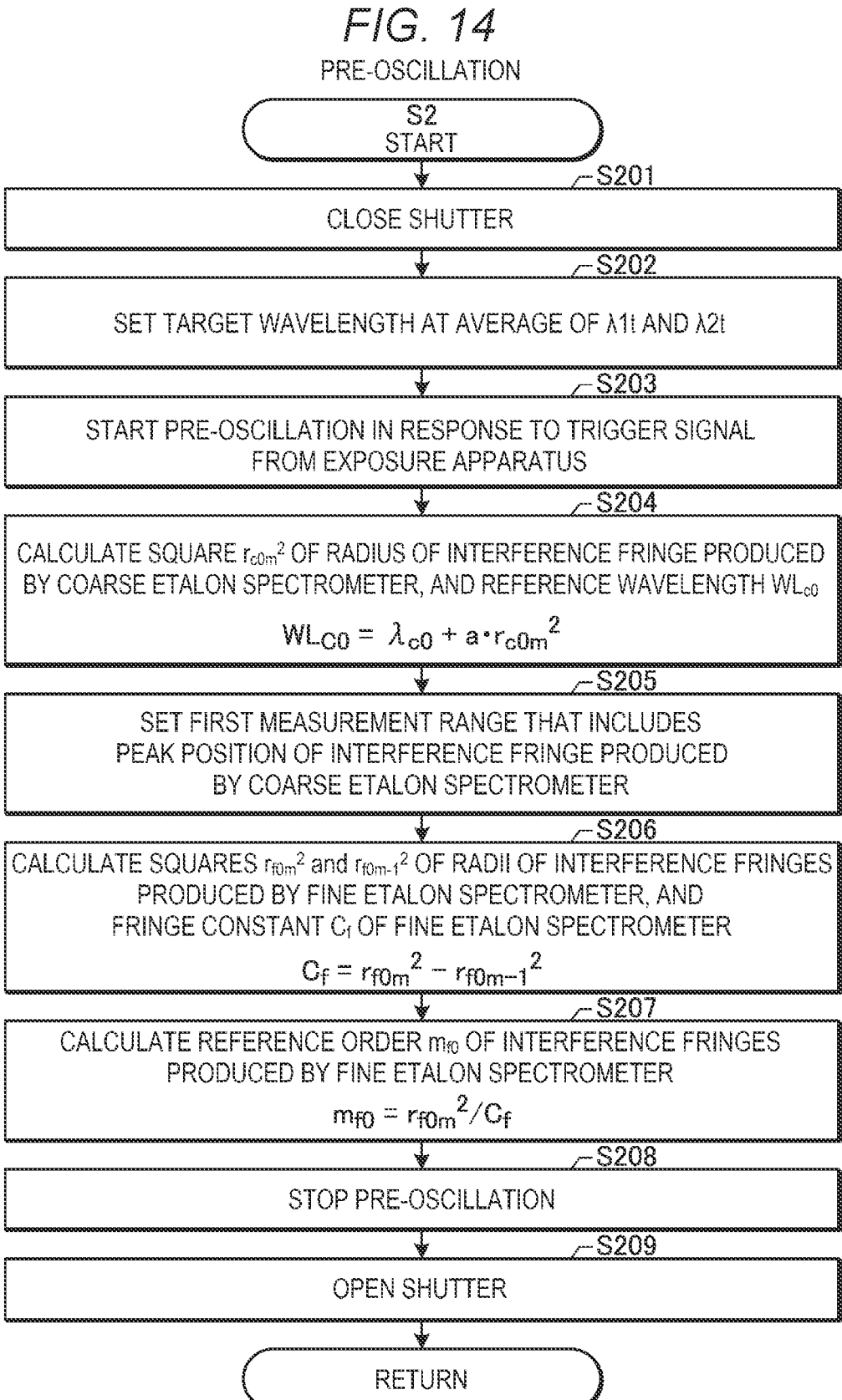

PRE-OSCILLATION

S2
START

S201

CLOSE SHUTTER

S202

SET TARGET WAVELENGTH AT AVERAGE OF $\lambda 1t$ AND $\lambda 2t$

S203

START PRE-OSCILLATION IN RESPONSE TO TRIGGER SIGNAL
FROM EXPOSURE APPARATUS

S204

CALCULATE SQUARE $r_{c0m}^2$ OF RADIUS OF INTERFERENCE FRINGE PRODUCED
BY COARSE ETALON SPECTROMETER, AND REFERENCE WAVELENGTH $WL_{c0}$ $$WL_{c0} = \lambda_{c0} + a \cdot r_{c0m}^2$$

S205

SET FIRST MEASUREMENT RANGE THAT INCLUDES
PEAK POSITION OF INTERFERENCE FRINGE PRODUCED
BY COARSE ETALON SPECTROMETER

S206

CALCULATE SQUARES $r_{f0m}^2$ and $r_{f0m-1}^2$ OF RADII OF INTERFERENCE FRINGES
PRODUCED BY FINE ETALON SPECTROMETER, AND
FRINGE CONSTANT $C_f$ OF FINE ETALON SPECTROMETER $$C_f = r_{f0m}^2 - r_{f0m-1}^2$$

S207

CALCULATE REFERENCE ORDER $m_{f0}$ OF INTERFERENCE FRINGES
PRODUCED BY FINE ETALON SPECTROMETER $$m_{f0} = r_{f0m}^2 / C_f$$

S208

STOP PRE-OSCILLATION

S209

OPEN SHUTTER

RETURN

FIG. 15

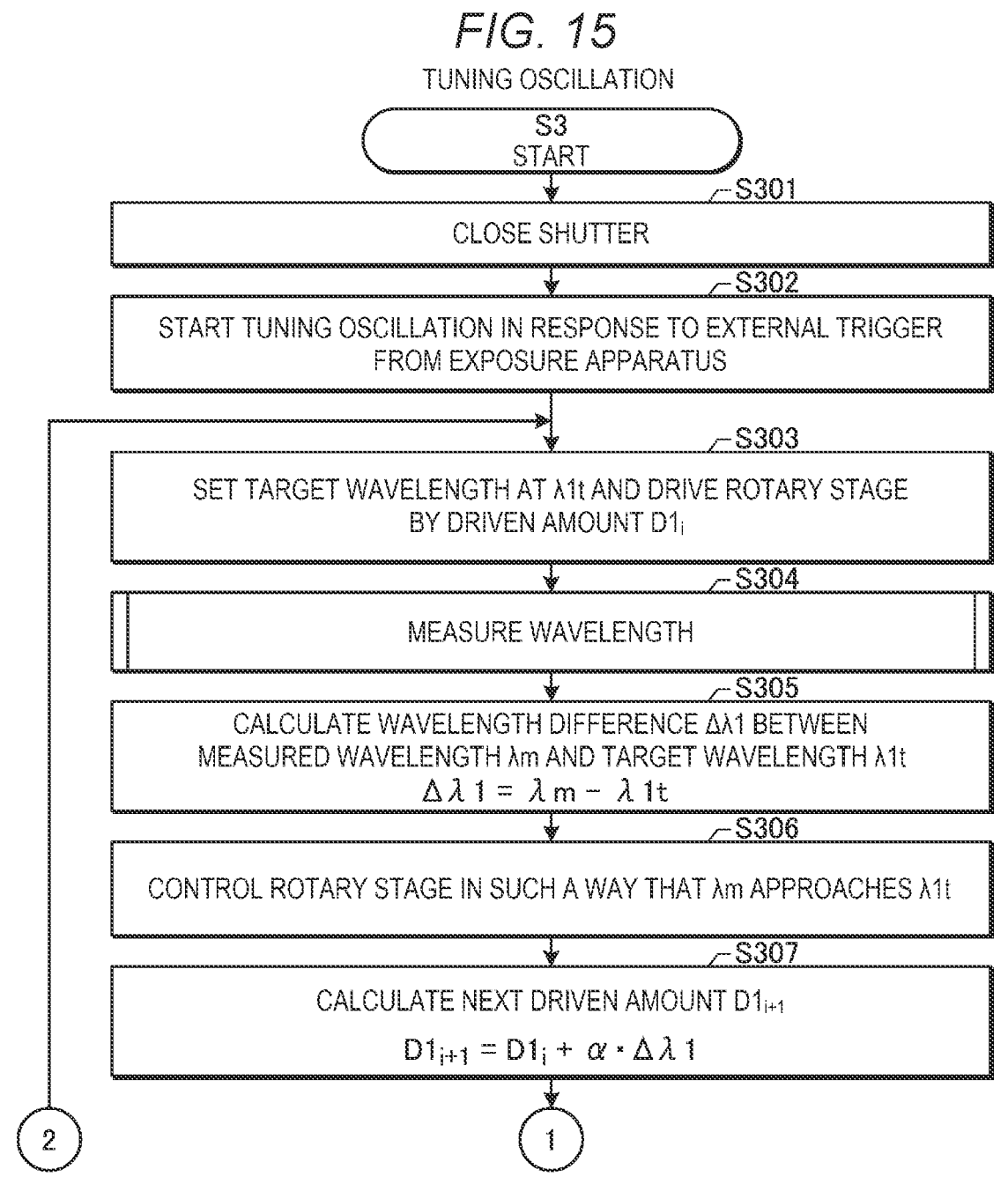

TUNING OSCILLATION

S3
START $\fbox{S301}$

CLOSE SHUTTER $\fbox{S302}$

START TUNING OSCILLATION IN RESPONSE TO EXTERNAL TRIGGER
FROM EXPOSURE APPARATUS $\fbox{S303}$ SET TARGET WAVELENGTH AT $\lambda 1t$ AND DRIVE ROTARY STAGE
BY DRIVEN AMOUNT $D1_i$ $\fbox{S304}$

MEASURE WAVELENGTH $\fbox{S305}$

CALCULATE WAVELENGTH DIFFERENCE $\Delta\lambda 1$ BETWEEN
MEASURED WAVELENGTH $\lambda m$ AND TARGET WAVELENGTH $\lambda 1t$ $$\Delta \lambda 1 = \lambda m - \lambda 1t$$

$\fbox{S306}$

CONTROL ROTARY STAGE IN SUCH A WAY THAT $\lambda m$ APPROACHES $\lambda 1t$ $\fbox{S307}$ CALCULATE NEXT DRIVEN AMOUNT $D1_{i+1}$ $$D1_{i+1} = D1_i + \alpha \cdot \Delta \lambda 1$$

2

1

WAVELENGTH MEASUREMENT

COARSE ETALON SPECTROMETER

FIRST MEASUREMENT RANGE          ctr          FIRST MEASUREMENT RANGE

WAVELENGTH MEASUREMENT

FINE ETALON SPECTROMETER

SECOND MEASUREMENT RANGE          ctr          SECOND MEASUREMENT RANGE

FIG. 19

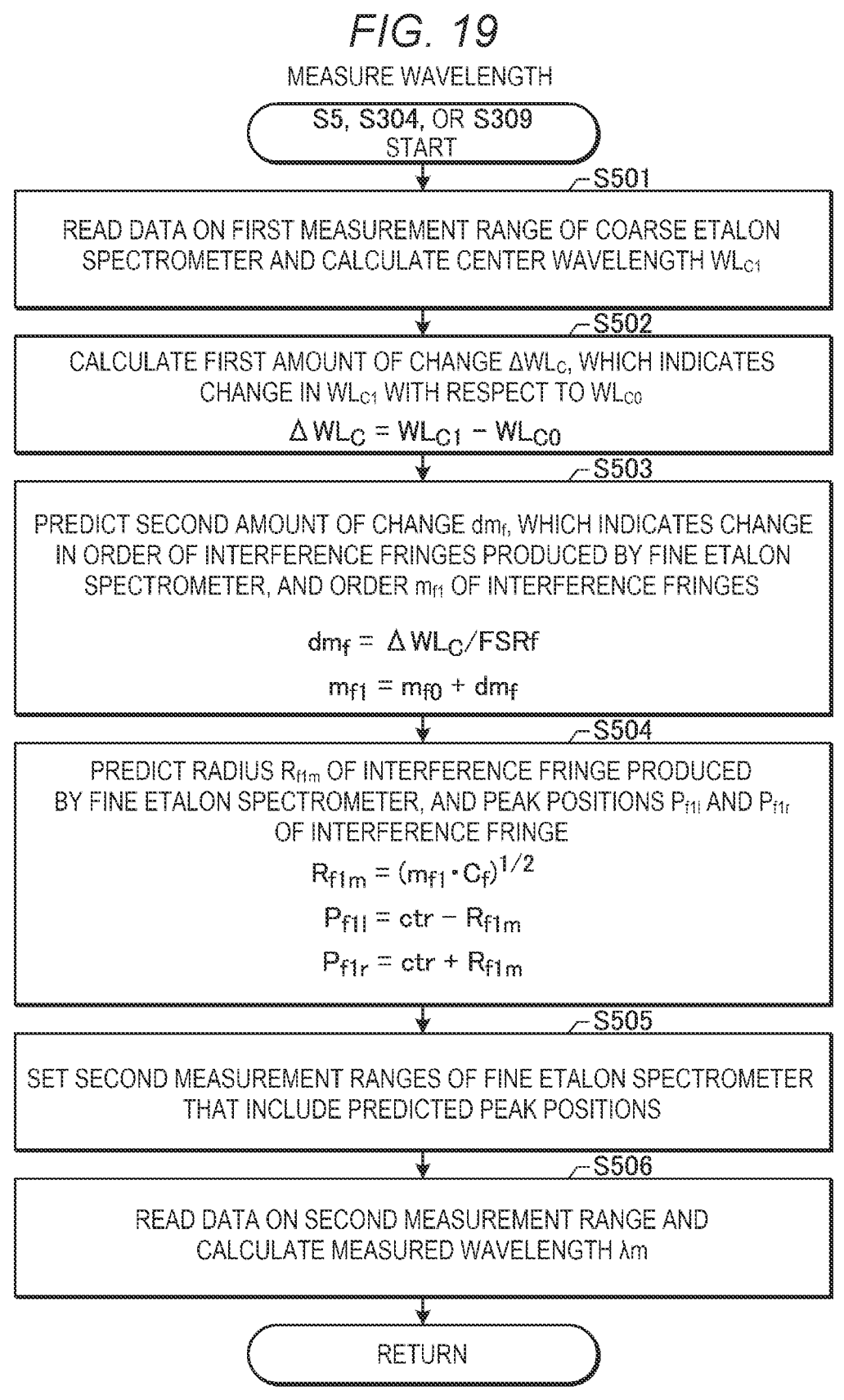

MEASURE WAVELENGTH $$\boxed{\text{S5, S304, OR S309}\atop\text{START}}$$

S501

READ DATA ON FIRST MEASUREMENT RANGE OF COARSE ETALON
SPECTROMETER AND CALCULATE CENTER WAVELENGTH $WL_{c1}$

S502

CALCULATE FIRST AMOUNT OF CHANGE $\Delta WL_c$, WHICH INDICATES
CHANGE IN $WL_{c1}$ WITH RESPECT TO $WL_{c0}$ $$\Delta WL_C = WL_{C1} - WL_{C0}$$

S503

PREDICT SECOND AMOUNT OF CHANGE $dm_f$, WHICH INDICATES CHANGE
IN ORDER OF INTERFERENCE FRINGES PRODUCED BY FINE ETALON
SPECTROMETER, AND ORDER $m_{f1}$ OF INTERFERENCE FRINGES $$dm_f = \Delta WL_C/FSRf$$

$$m_{f1} = m_{f0} + dm_f$$

S504

PREDICT RADIUS $R_{f1m}$ OF INTERFERENCE FRINGE PRODUCED
BY FINE ETALON SPECTROMETER, AND PEAK POSITIONS $P_{f1l}$ AND $P_{f1r}$
OF INTERFERENCE FRINGE $$R_{f1m} = (m_{f1} \cdot C_f)^{1/2}$$

$$P_{f1l} = ctr - R_{f1m}$$

$$P_{f1r} = ctr + R_{f1m}$$

S505

SET SECOND MEASUREMENT RANGES OF FINE ETALON SPECTROMETER
THAT INCLUDE PREDICTED PEAK POSITIONS

S506

READ DATA ON SECOND MEASUREMENT RANGE AND
CALCULATE MEASURED WAVELENGTH $\lambda m$ $$\boxed{\text{RETURN}}$$

WAVELENGTH MEASUREMENT APPARATUS, NARROWED-LINE LASER APPARATUS, AND METHOD FOR MANUFACTURING ELECTRONIC DEVICES

CROSS-REFERENCE TO RELATED APPLICATIONS

The present application is a continuation application of International Application No. PCT/JP2021/020383, filed on May 28, 2021, the entire contents of which are hereby incorporated by reference.

BACKGROUND

1. Technical Field

The present disclosure relates to a wavelength measurement apparatus, a narrowed-line laser apparatus, and a method for manufacturing electronic devices.

2. Related Art

In recent years, a semiconductor exposure apparatus is required to improve the resolution thereof as semiconductor integrated circuits are increasingly miniaturized and highly integrated. To this end, reduction in the wavelength of light emitted from a light source for exposure is underway. For example, a KrF excimer laser apparatus, which outputs a laser beam having a wavelength of about 248 nm, and an ArF excimer laser apparatus, which outputs a laser beam having a wavelength of about 193 nm, are used as a gas laser apparatus for exposure.

The light from spontaneously oscillating KrF and ArF excimer laser apparatuses has a wide spectral linewidth ranging from 350 to 400 pm. A projection lens made of a material that transmits ultraviolet light, such as the KrF and ArF laser beams, therefore undesirably produces chromatic aberrations in some cases. As a result, the resolution of the projection lens may decrease. To avoid the decrease in the resolution, the spectral linewidth of the laser beam output from the gas laser apparatus needs to be narrow enough to make the chromatic aberrations negligible. To this end, a line narrowing module (LNM) including a line narrowing element (etalon or grating) is provided in some cases in a laser resonator of the gas laser apparatus to narrow the spectral linewidth. A gas laser apparatus providing a narrowed spectral linewidth is hereinafter referred to as a narrowed-line laser apparatus.

CITATION LIST

Patent Literature

[PTL 1] U.S. Patent application Publication No. 2002/167975
[PTL 2] JP5-007031A
[PTL 3] U.S. Patent application Publication No. 2019/033133

SUMMARY

A wavelength measurement apparatus according to an aspect of the present disclosure includes a first spectrometer having a first free spectral range and configured to generate a first measured waveform from an interference pattern produced by a pulse laser beam, a second spectrometer having a second free spectral range narrower than the first free spectral range and configured to generate a second measured waveform from the interference pattern produced by the pulse laser beam, and a processor configured to read data on a first measurement range of the first spectrometer, set a second measurement range of the second spectrometer based on the data on the first measurement range, read data on the second measurement range, and calculate a center wavelength of the pulse laser beam based on the data on the first measurement range and the data on the second measurement range.

A narrowed-line laser apparatus according to another aspect of the present disclosure includes a laser oscillator configured to output a pulse laser beam, a line-narrowing optical system disposed in the laser oscillator, an actuator configured to change a wavelength selected by the line-narrowing optical system, a first spectrometer having a first free spectral range and configured to generate a first measured waveform from an interference pattern produced by the pulse laser beam, a second spectrometer having a second free spectral range narrower than the first free spectral range and configured to generate a second measured waveform from the interference pattern produced by the pulse laser beam, and a processor configured to set a target wavelength based on a wavelength instruction value received from an external apparatus, read data on a first measurement range of the first spectrometer, set a second measurement range of the second spectrometer based on the data on the first measurement range, read data on the second measurement range, calculate a center wavelength of the pulse laser beam based on the data on the first measurement range and the data on the second measurement range, and control the actuator based on the target wavelength and the center wavelength.

A method for manufacturing electronic devices according to another aspect of the present disclosure includes generating pulse laser beam by using a narrowed-line laser apparatus, outputting the pulse laser beam to an exposure apparatus, and exposing a photosensitive substrate to the pulse laser beam in the exposure apparatus to manufacture the electronic devices, the narrowed-line laser apparatus including a laser oscillator configured to output the pulse laser beam, a line-narrowing optical system disposed in the laser oscillator, an actuator configured to change a wavelength selected by the line-narrowing optical system, a first spectrometer having a first free spectral range and configured to generate a first measured waveform from an interference pattern produced by the pulse laser beam, a second spectrometer having a second free spectral range narrower than the first free spectral range and configured to generate a second measured waveform from the interference pattern produced by the pulse laser beam, and a processor configured to set a target wavelength based on a wavelength instruction value received from the exposure apparatus, read data on a first measurement range of the first spectrometer, set a second measurement range of the second spectrometer based on the data on the first measurement range, read data on the second measurement range, calculate a center wavelength of the pulse laser beam based on the data on the first measurement range and the data on the second measurement range, and control the actuator based on the target wavelength and the center wavelength.

BRIEF DESCRIPTION OF THE DRAWINGS

Embodiments of the present disclosure will be described below only by way of example with reference to the accompanying drawings.

FIG. 1 schematically shows the configuration of an exposure system according to Comparative Example.

FIG. 3 is a graph showing wavelength measurement ranges of a coarse etalon spectrometer and a fine etalon spectrometer in Comparative Example.

FIG. 4 is a graph showing an example of a change in wavelength in Comparative Example.

FIG. 5 is an enlarged graph of part of FIG. 3.

FIG. 6 is a graph showing wavelength measurement ranges of the coarse etalon spectrometer and the fine etalon spectrometer in an embodiment of the present disclosure.

FIG. 7 is a graph showing an example of the change in wavelength in the embodiment.

FIG. 8 is an enlarged graph of part of FIG. 6.

FIG. 11 is a graph showing an example of a first measured waveform produced by detection of interference fringes produced by the coarse etalon spectrometer when pre-oscillation is performed in the embodiment.

FIG. 12 is a graph showing an example of a second measured waveform produced by detection of the interference fringes produced by the fine etalon spectrometer when the pre-oscillation is performed in the embodiment.

FIG. 13 shows an example of a method for calculating the radius of an interference fringe.

FIG. 14 is a flowchart showing the pre-oscillation processing in detail in the embodiment.

FIG. 15 is a flowchart showing tuning oscillation processing in detail in the embodiment.

FIG. 19 is a flowchart showing the wavelength measurement processing in detail in the embodiment.

DETAILED DESCRIPTION

Figure 2:
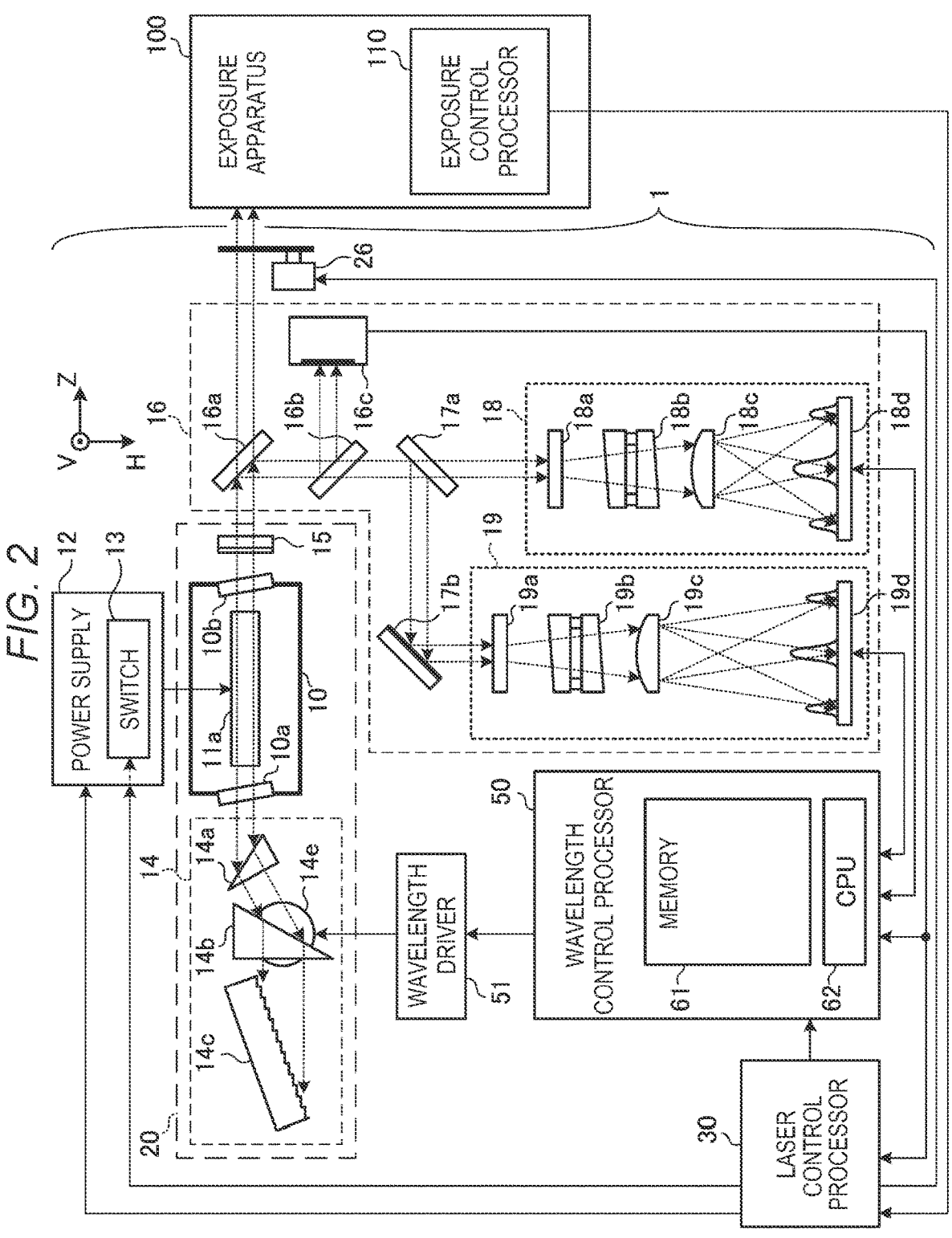
FIG. 2 diagrammatically shows the configuration of a narrowed-line laser apparatus according to Comparative Example.

<Contents>
1. Comparative Example
1.1 Configuration of exposure apparatus 100
1.2 Operation of exposure apparatus 100
1.3 Configuration of narrowed-line laser apparatus 1
1.3.1 Laser oscillator 20
1.3.2 Monitor module 16
1.3.3 Shutter 26
1.3.4 Variety of processing apparatuses
1.4 Operation of narrowed-line laser apparatus 1
1.4.1 Laser control processor 30
1.4.2. Laser oscillator 20
1.4.3 Monitor module 16
1.4.4 Wavelength control processor 50
1.5 Problems with Comparative Example 2. Narrowed-line laser apparatus 1a in which second measurement range is set based on data on first measurement range
2.1 Overview
2.2 Configuration
2.3 Operation
2.3.1 Overall procedure
2.3.2 Details of pre-oscillation
2.3.3 Details of tuning oscillation
2.3.4 Details of wavelength measurement
2.4 Effects
3. Others An embodiment of the present disclosure will be described below in detail with reference to the drawings. The embodiment described below shows some examples of the present disclosure and are not intended to limit the contents of the present disclosure. Furthermore, all configurations and operations described in the embodiment are not necessarily essential as configurations and operations in the present disclosure. The same component has the same reference character, and no duplicate description of the same component will be made.

1. Comparative Example

Figure 1:
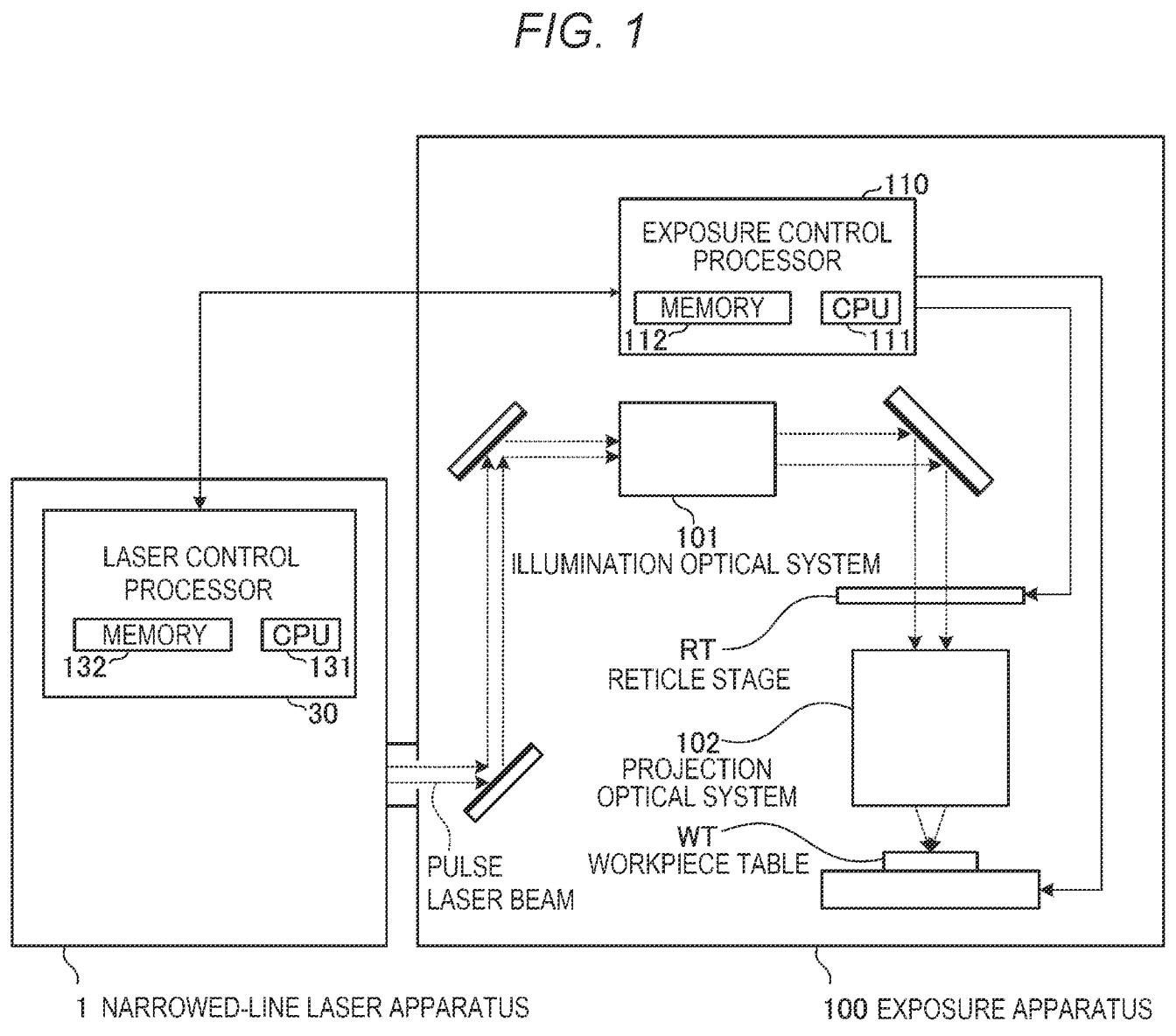

FIG. 1 schematically shows the configuration of an exposure system according to Comparative Example. Comparative Example in the present disclosure is an aspect that the applicant is aware of as known only by the applicant, and is not a publicly known example that the applicant is self-aware of.

The exposure system includes a narrowed-line laser apparatus 1 and an exposure apparatus 100. The exposure apparatus 100 is an example of the external apparatus in the present disclosure. The narrowed-line laser apparatus 1 includes a laser control processor 30. The laser control processor 30 is a processing apparatus including a memory 132, which stores a control program, and a CPU (central processing unit) 131, which executes the control program. The laser control processor 30 is particularly configured or programmed to carry out a variety of processes included in the present disclosure. The laser control processor 30 corresponds to the processor in the present disclosure. The narrowed-line laser apparatus 1 is configured to output a pulse laser beam toward the exposure apparatus 100.

1.1 Configuration of Exposure Apparatus 100

The exposure apparatus 100 includes an illumination optical system 101, a projection optical system 102, and an exposure control processor 110.

The illumination optical system 101 illuminates a reticle pattern of a reticle that is not shown but is placed on a reticle stage RT with the pulse laser beam having entered the exposure apparatus 100 from the narrowed-line laser apparatus 1.

The projection optical system 102 performs reduction projection on the pulse laser beam having passed through the reticle to bring the pulse laser beam into focus on a workpiece that is not shown but is placed on a workpiece table WT. The workpiece is a light sensitive substrate, such as a semiconductor wafer, onto which a photoresist has been applied in the form of a film.

The exposure control processor 110 is a processing apparatus including a memory 112, which stores a control program, and a CPU 111, which executes the control program. The exposure control processor 110 is particularly configured or programmed to carry out a variety of processes included in the present disclosure. The exposure control processor 110 oversees and controls the exposure apparatus 100 and transmits and receives a variety of data and signals to and from the laser control processor 30.

1.2 Operation of Exposure Apparatus 100

The exposure control processor 110 transmits wavelength instruction value data, which instructs a target wavelength, target pulse energy setting value data, and a trigger signal to the laser control processor 30. The laser control processor 30 controls the narrowed-line laser apparatus 1 in accordance with the data and the signals.

The exposure control processor 110 translates the reticle stage RT and the workpiece table WT in opposite directions in synchronization with each other. The workpiece is thus exposed to the pulse laser beam having reflected the reticle pattern.

The exposure step described above causes the reticle pattern to be transferred to the semiconductor wafer. The following multiple steps allow manufacture of electronic devices.

1.3 Configuration of Narrowed-Line Laser Apparatus 1

FIG. 2 diagrammatically shows the configuration of the narrowed-line laser apparatus 1 according to Comparative Example. The narrowed-line laser apparatus 1 includes a laser oscillator 20, a power supply 12, a monitor module 16, the laser control processor 30, and a wavelength control processor 50. The narrowed-line laser apparatus 1 is connectable to the exposure apparatus 100. The monitor module 16, the laser control processor 30, and the wavelength control processor 50 constitute the wavelength measurement apparatus in the present disclosure.

1.3.1 Laser Oscillator 20

The laser oscillator 20 includes a laser chamber 10, a discharge electrode 11a, a line narrowing module 14, an output coupling mirror 15, and a shutter 26.

The line narrowing module 14 and the output coupling mirror 15 form a laser resonator. The laser chamber 10 is disposed in the optical path of the laser resonator. Windows 10a and 10b are provided at opposite ends of the laser chamber 10. The discharge electrode 11a and a discharge electrode that is not shown but is paired therewith are disposed in the laser chamber 10. The discharge electrode that is not shown is located so as to coincide with the discharge electrode 11a in the direction of an axis V perpendicular to the plane of view. The laser chamber 10 is filled with a laser gas containing, for example, an argon or a krypton gas as a rare gas, a fluorine gas as a halogen gas, and a neon gas as a buffer gas.

The power supply 12 includes a switch 13 and is connected to the discharge electrode 11a and a charger that is not shown.

The line narrowing module 14 includes a plurality of prisms 14a and 14b and a grating 14c. The prism 14b is supported by a rotary stage 14e. The rotary stage 14e is configured to rotate the prism 14b around an axis parallel to the axis V in accordance with a drive signal output from a wavelength driver 51. Rotating the prism 14b via the rotary stage 14e changes the wavelength selected by the line narrowing module 14. The line narrowing module 14 corresponds to the line narrowing optical system in the present disclosure, and the rotary stage 14e corresponds to the actuator in the present disclosure.

One surface of the output coupling mirror 15 is coated with a partially reflective film.

1.3.2 Monitor Module 16

The monitor module 16 is disposed in the optical path of the pulse laser beam between the output coupling mirror 15 and the exposure apparatus 100. The monitor module 16 includes beam splitters 16a, 16b, and 17a, an energy sensor 16c, a highly reflective mirror 17b, a coarse etalon spectrometer 18, and a fine etalon spectrometer 19. The coarse etalon spectrometer 18 corresponds to the first spectrometer in the present disclosure, and the fine etalon spectrometer 19 corresponds to the second spectrometer in the present disclosure.

The beam splitter 16a is located in the optical path of the pulse laser beam output via the output coupling mirror 15. The beam splitter 16a is configured to transmit part of the pulse laser beam output via the output coupling mirror 15 at high transmittance toward the exposure apparatus 100 and reflect the other part of the pulse laser beam. The beam splitter 16b is located in the optical path of the pulse laser beam reflected off the beam splitter 16a. The energy sensor 16c is located in the optical path of the pulse laser beam reflected off the beam splitter 16b.

The beam splitter 17a is located in the optical path of the pulse laser beam having passed through the beam splitter 16b. The highly reflective mirror 17b is located in the optical path of the pulse laser beam reflected off the beam splitter 17a.

The coarse etalon spectrometer 18 is disposed in the optical path of the pulse laser beam having passed through the beam splitter 17a. The coarse etalon spectrometer 18 includes a diffusion plate 18a, an etalon 18b, a light condensing lens 18c, and a line sensor 18d.

The diffusion plate 18a is located in the optical path of the pulse laser beam having passed through the beam splitter 17a. The diffusion plate 18a has a large number of irregularities at a surface thereof and is configured to transmit and diffuse the pulse laser beam.

The etalon 18b is located in the optical path of the pulse laser beam having passed through the diffusion plate 18a. The etalon 18b includes two partially reflective mirrors. The two partially reflective mirrors face each other with an air gap having a predetermined thickness therebetween and are bonded to each other via a spacer.

The light condensing lens 18c is located in the optical path of the pulse laser beam having passed through the etalon 18b.

The line sensor 18d is located at the focal plane of the light condensing lens 18c in the optical path of the pulse laser beam having passed through the light condensing lens 18c. The line sensor 18d receives interference fringes formed by the etalon 18b and the light condensing lens 18c. The interference fringes are an interference pattern produced by the pulse laser beam and have a shape of concentric circles, and the square of the distance from the center of the concentric circles is proportional to the change in the wavelength of the pulse laser beam.

The line sensor 18d is a light distribution detecting sensor including a large number of light receivers arranged in one dimension. In place of the line sensor 18d, an image sensor including a large number of light receivers arranged two-dimensionally may instead be used as the light distribution detecting sensor. The light receivers are each called a channel. The light intensity distribution of the interference fringes is obtained from the light intensity detected at each of the channels.

The fine etalon spectrometer 19 is disposed in the optical path of the pulse laser beam reflected off the highly reflective mirror 17b. The fine etalon spectrometer 19 includes a diffusion plate 19a, an etalon 19b, a light condensing lens 19c, and a line sensor 19d. These configurations are the same as those of the diffusion plate 18a, the etalon 18b, the light condensing lens 18c, and the line sensor 18d incorporated in the coarse etalon spectrometer 18. Note, however, that the etalon 19b has a free spectral range narrower than that of the etalon 18b. The free spectral range will be described later. Further note that the light condensing lens 19c has a focal length longer than that of the light condensing lens 18c.

1.3.3 Shutter 26

The shutter 26 is disposed in the optical path of the pulse laser beam between the monitor module 16 and the exposure apparatus 100. The shutter 26 is configured to be switchable between a first state in which the shutter 26 allows the pulse laser beam output from the laser oscillator 20 to travel toward the exposure apparatus 100 and a second state in which the shutter 26 blocks the pulse laser beam. Operating the shutter 26 in the first state is called opening the shutter 26, and operating the shutter 26 in the second state is called closing the shutter 26.

1.3.4 Variety of Processing Apparatuses

The wavelength control processor 50 is a processing apparatus including a memory 61, which stores a control program, and a CPU 62, which executes the control program. The wavelength control processor 50 is particularly configured or programmed to carry out a variety of processes included in the present disclosure.

The memory 61 also stores a variety of data used to calculate the center wavelength of the pulse laser beam.

FIG. 2 shows that the laser control processor 30 and the wavelength control processor 50 are components separate from each other, but the laser control processor 30 may also serve as the wavelength control processor 50.

1.4 Operation of Narrowed-Line Laser Apparatus 1

1.4.1 Laser Control Processor 30

The laser control processor 30 receives from the exposure control processor 110, which is incorporated in the exposure apparatus 100, the wavelength instruction value data, which instructs the target wavelength, the target pulse energy setting value data, and the trigger signal.

The laser control processor 30 transmits to the power supply 12 set data on application voltage to be applied to the discharge electrode 11a based on the set value of the target pulse energy. The laser control processor 30 transmits the wavelength instruction value data to the wavelength control processor 50. The laser control processor 30 further transmits an oscillation trigger signal based on the trigger signal to the switch 13 incorporated in the power supply 12.

1.4.2. Laser Oscillator 20

The switch 13 is turned on when the switch 13 receives the oscillation trigger signal from the laser control processor 30. When the switch 13 is turned on, the power supply 12 generates a pulse-shaped high voltage from the electric energy charged in the charger that is not shown and applies the high voltage to the discharge electrode 11a.

When the high voltage is applied to the discharge electrode 11a, discharge occurs in the laser chamber 10. The energy of the discharge excites a laser medium in the laser chamber 10, and the excited laser medium transitions to a high energy level. Thereafter, when the excited laser medium transitions to a low energy level, the laser medium emits light having a wavelength according to the difference between the energy levels.

The light generated in the laser chamber 10 exits out of the laser chamber 10 via the windows 10a and 10b. The light having exited via the window 10a of the laser chamber 10 is enlarged in terms of beam width by the prisms 14a and 14b and is then incident on the grating 14c.

The light incident from the prisms 14a and 14b on the grating 14c is reflected off and diffracted by a plurality of grooves of the grating 14c in the direction according to the wavelength of the light.

The prisms 14a and 14b reduce the beam width of the diffracted light from the grating 14c and cause the light to return into the laser chamber 10 via the window 10a.

The output coupling mirror 15 transmits and outputs part of the light having exited via the window 10b of the laser chamber 10 and reflects the other part of the light back into the laser chamber 10 via the window 10b.

The light having exited out of the laser chamber 10 thus travels back and forth between the line narrowing module 14 and the output coupling mirror 15 and is amplified whenever passing through the discharge space in the laser chamber 10. The light undergoes the line narrowing operation whenever deflected back by the line narrowing module 14. The light thus having undergone the laser oscillation and the line narrowing operation is output as the pulse laser beam via the output coupling mirror 15.

1.4.3 Monitor Module 16

The energy sensor 16c detects the pulse energy of the pulse laser beam and outputs data on the pulse energy to the laser control processor 30 and the wavelength control processor 50. The data on the pulse energy is used by the laser control processor 30 to perform feedback control on the set data on the application voltage to be applied to the discharge electrode 11a. The timing at which the data on the pulse energy is received can be used as a reference for the timing at which the wavelength control processor 50 outputs data output triggers to the coarse etalon spectrometer 18 and the fine etalon spectrometer 19.

The coarse etalon spectrometer 18 generates the first measured waveform from the interference pattern produced by the pulse laser beam and detected by the line sensor 18d. The coarse etalon spectrometer 18 transmits the first measured waveform to the wavelength control processor 50 in accordance with the data output trigger output from the wavelength control processor 50.

The fine etalon spectrometer 19 generates the second measured waveform from the interference pattern produced by the pulse laser beam and detected by the line sensor 19d. The fine etalon spectrometer 19 transmits the second measured waveform to the wavelength control processor 50 in accordance with the data output trigger output from the wavelength control processor 50.

The first and second measured waveforms are each also called a fringe waveform, which indicates the relationship between the distance from the center of the concentric circles, which constitute the interference fringes, and the light intensity.

1.4.4 Wavelength Control Processor 50

The wavelength control processor 50 receives the wavelength instruction value, which instructs the target wavelength, from the laser control processor 30. The wavelength control processor 50 uses the measured waveforms output from the coarse etalon spectrometer 18 and the fine etalon spectrometer 19 to calculate the center wavelength of the pulse laser beam as a measured wavelength $\lambda$m. The wavelength control processor 50 performs feedback control on the center wavelength of the pulse laser beam by outputting a control signal to the wavelength driver 51 based on the target wavelength and the measured wavelength $\lambda$m.

1.5 Problems with Comparative Example

In general, the condition for etalon interference is given by Expression 1 below, in which the order m of each of the interference fringes is an integer.

$$m\lambda = 2nd \cdot \cos\theta \qquad \text{Expression 1}$$

where $\lambda$, is the center wavelength of the pulse laser beam, n is the refractive index of the air gap between the two partially reflective mirrors that constitute the etalon, d is the distance between the two partially reflective mirrors, and $\theta$ is the tilt angle of the pulse laser beam passing through the air gap between the two partially reflective mirrors.

When the center wavelength $\lambda$, is changed, the center wavelength $\lambda$, that satisfies the interference condition expressed by Expression 1 appears cyclically. The cycle is called a free spectral range FSR.

In general, the resolution R of an etalon is expressed by the following expression:

$$R = FSR/F$$

where FSR is the free spectral range of the etalon, and F is the finesse of the etalon.

When the etalon 18b and the etalon 19b have substantially the same finesse F, the smaller the free spectral range FSR, the higher the resolution R. The etalon 19b can therefore measure the change in wavelength in more detail than the etalon 18b.

However, when changes in wavelength coincide with multiples of the free spectral range FSRf of the etalon 19b, the interference fringes detected by using the etalon 19b are almost identical to one another, so that whether a change in wavelength has occurred cannot be evaluated only by the result of the measurement performed by the etalon 19b. Therefore, combining the etalon 19b with the etalon 18b having a larger free spectral range FSRc allows highly accurate measurement of a change in wavelength over a wide range.

FIG. 3 is a graph showing the wavelength measurement ranges of the coarse etalon spectrometer 18 and the fine etalon spectrometer 19 in Comparative Example. The horizontal axis of FIG. 3 represents the wavelength. It is assumed that the free spectral range FSRc of the etalon 18b is 500 pm, and that the free spectral range FSRf of the etalon 19b is 10 pm. The free spectral range FSRc of the etalon 18b corresponds to the first free spectral range in the present disclosure, and the free spectral range FSRf of the etalon 19b corresponds to the second free spectral range in the present disclosure.

FIG. 4 is a graph showing an example of a change in wavelength in Comparative Example. The horizontal axis of FIG. 4 represents the wavelength, and the vertical axis of FIG. 4 represents time. When the change in wavelength from a first wavelength to a second wavelength is smaller than the free spectral range FSRf of the etalon 19b, the change in wavelength can be derived from the result of the measurement performed by the fine etalon spectrometer 19.

FIG. 5 is an enlarged graph of part of FIG. 3. When the change in wavelength is greater than the free spectral range FSRf of the etalon 19b, the order of each of the interference fringes cannot be determined from the result of the measurement performed by the fine etalon spectrometer 19, so that the change in wavelength cannot be derived.

When the change in wavelength from the first wavelength to the second wavelength is smaller than the free spectral range FSRc of the etalon 18b, the center wavelength $\lambda$, can be calculated by combining the results of the measurement performed by the coarse etalon spectrometer 18 and the fine etalon spectrometer 19. However, to frequently change the wavelength, the calculation of the center wavelength $\lambda$, may not keep up with the change.

In the embodiment described below, a second measurement range of the fine etalon spectrometer 19 is set based on data on a first measurement range of the coarse etalon spectrometer 18, and the center wavelength of the pulse laser beam is calculated as the measured wavelength $\lambda m$ based on the data on the first measurement range and the data on the second measurement range. The second measurement range is set based on the data on the first measurement range to properly set the second measurement range, and the data on the first and second measurement ranges are used to reduce the amount of calculation to accelerate the measurement of the measured wavelength $\lambda m$.

2. Narrowed-Line Laser Apparatus La in which Second Measurement Range is Set Based on Data on First Measurement Range

2.1 Overview

FIG. 6 is a graph showing wavelength measurement ranges of the coarse etalon spectrometer 18 and the fine etalon spectrometer 19 in an embodiment of the present disclosure. FIG. 7 is a graph showing an example of the change in wavelength in the embodiment.

The first measurement range is a measurement range corresponding to a first wavelength range shown in FIGS. 6 and 7 out of the measurement range of the coarse etalon spectrometer 18. The first wavelength range is narrower than the free spectral range FSRc of the etalon 18b but wider than the free spectral range FSRf of the etalon 19b. When the center wavelength of the pulse laser beam is changed to a value between the first wavelength and the second wavelength, the first wavelength range includes both the first wavelength and the second wavelength. That is, the first measurement range set when the first wavelength is the same as that set when the second wavelength is measured. The wavelength difference between the first wavelength and the second wavelength is greater than the free spectral range FSRf of the etalon 19b.

The other points in FIGS. 6 and 7 are the same as those in FIGS. 3 and 4.

FIG. 8 is an enlarged graph of part of FIG. 6. In the embodiment, the second measurement range of the fine etalon spectrometer 19 is set based on the data on the first measurement range of the coarse etalon spectrometer 18. The second measurement range is a measurement range corresponding to a second wavelength range shown in FIG. 8 out of the measurement range of the fine etalon spectrometer 19.

When the first wavelength is detected from the data on the first measurement range, the second measurement range is so set that the first wavelength falls within the second wavelength range. When the second wavelength is detected from the data on the first measurement range, the second measurement range is so set that the second wavelength falls within the second wavelength range. That is, the second measurement range set when the first wavelength is measured differs from that set when the second wavelength is measured. The second wavelength range is narrower than the free spectral range FSRf of the etalon 19b.

2.2 Configuration

Figure 9:
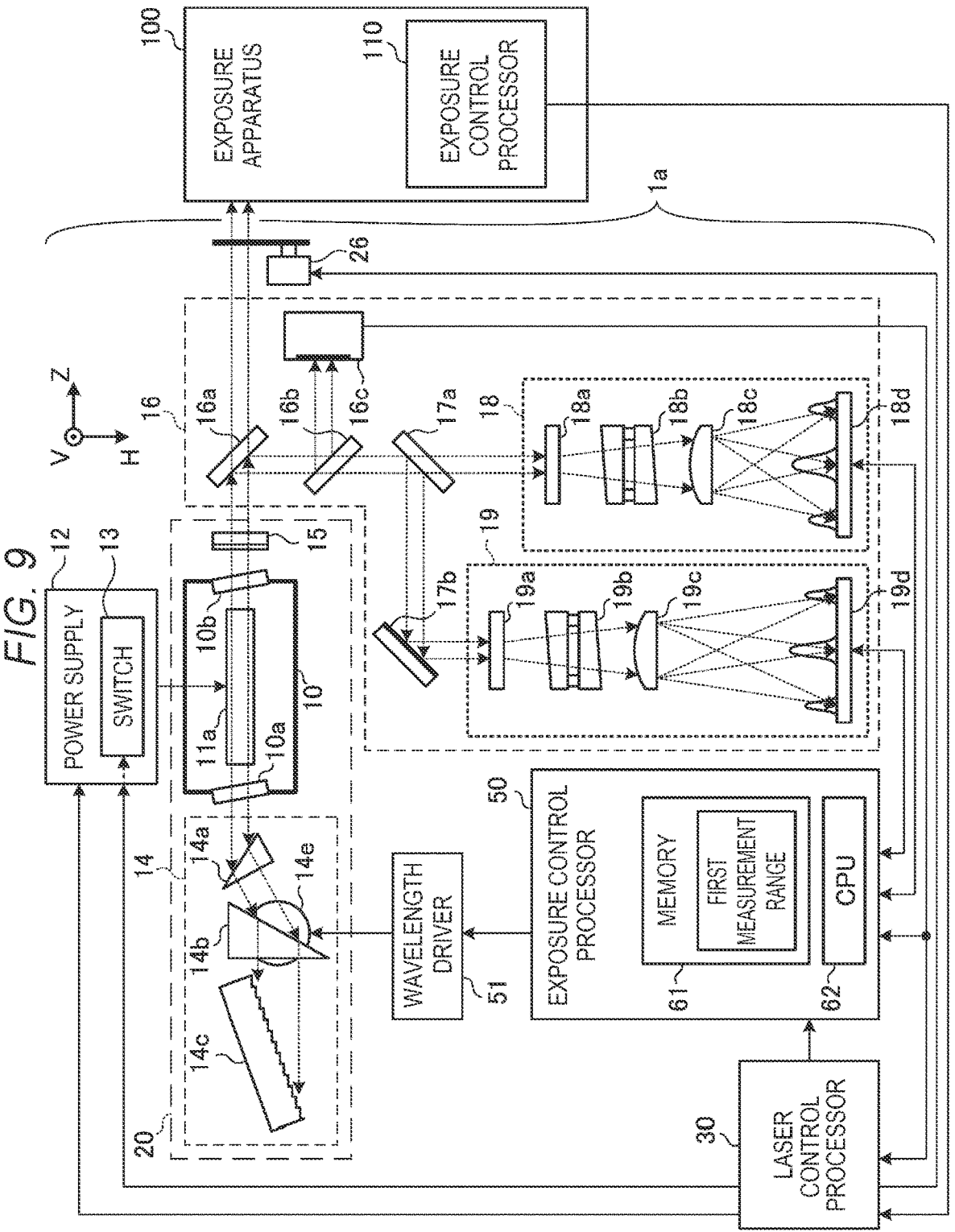
FIG. 9 diagrammatically shows the configuration of a narrowed-line laser apparatus according to an embodiment.

FIG. 9 diagrammatically shows the configuration of a narrowed-line laser apparatus 1a according to the embodiment. In the narrowed-line laser apparatus 1a, the memory 61 incorporated in the wavelength control processor 50 stores data that specifies the first measurement range. The first measurement range is set by pre-oscillation, which will be described later, and stored in the memory 61. The memory 61 may store a reference wavelength $WL_{C0}$, a reference order mm, a fringe constant $C_f$, and other parameters in addition to the first measurement range.

2.3 Operation 2.3.1 Overall Procedure

Figure 10:
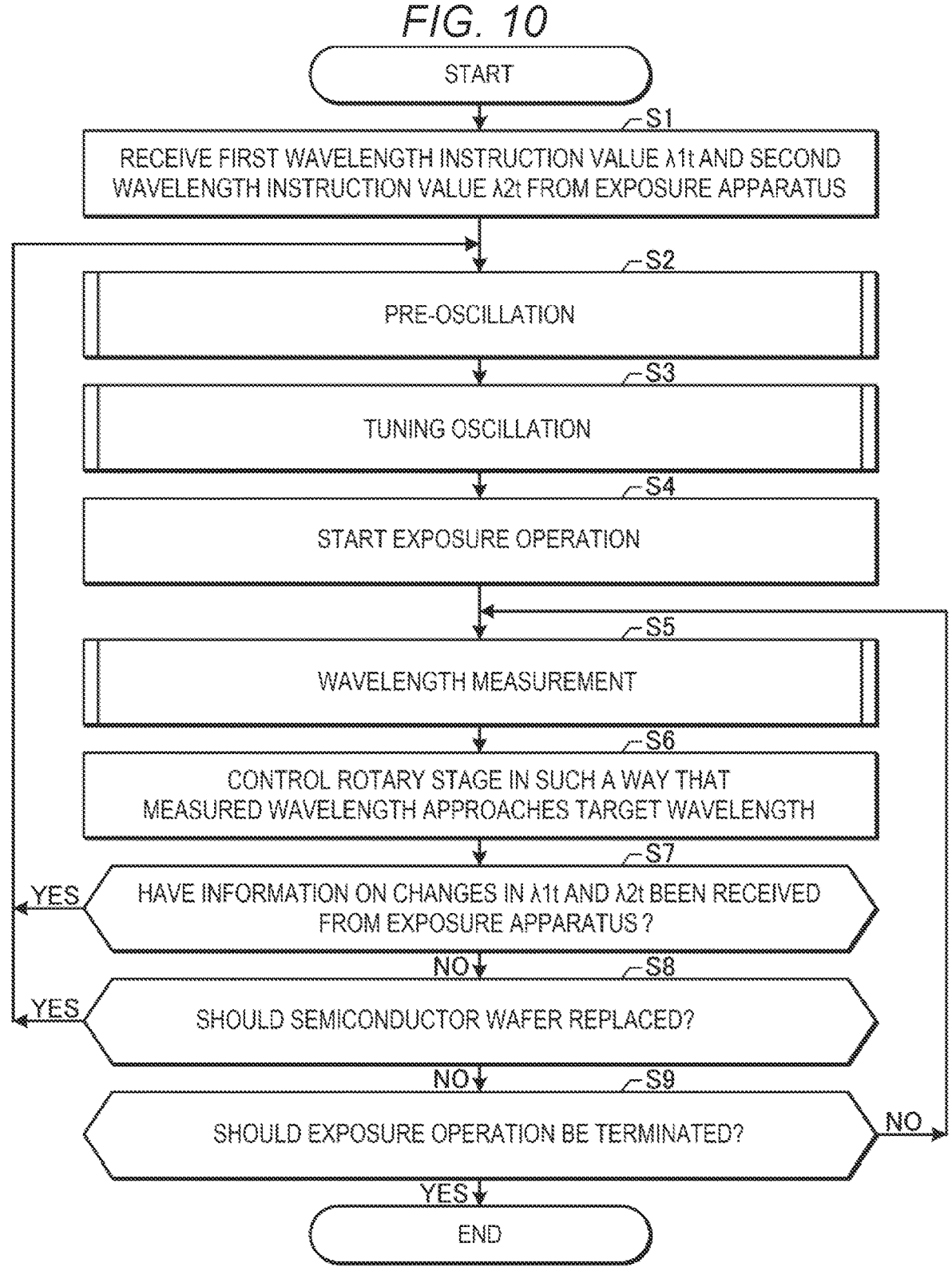
FIG. 10 is a flowchart showing processes carried out by a laser control processor in the embodiment.

FIG. 10 is a flowchart showing processes carried out by the laser control processor 30 in the embodiment. In place of the laser control processor 30, the wavelength control processor 50 may carry out the processes shown in FIG. 10.

In S1, the laser control processor 30 receives a first wavelength instruction value $\lambda 1t$ and a second wavelength instruction value $\lambda 2t$ from the exposure control processor 110. The following description will be made with reference to a case where the narrowed-line laser apparatus 1*a* alternately performs laser oscillation at two wavelengths, and the embodiment is also applicable to the case of laser oscillation at one wavelength.

The focal length in the exposure apparatus 100 depends on the wavelength of the pulse laser beam. The pulse laser beams having undergone the laser oscillation at two wavelengths and entered the exposure apparatus 100 form images at positions different from each other in the direction of the optical path axis of the pulse laser beams, so that the depth of focus can be practically increased. For example, even when a photoresist film having a large thickness is exposed to the pulse laser beam, the imaging performance can be maintained in the thickness direction of the photoresist film.

In S2, the laser control processor 30 sets the target wavelength at a value between the first wavelength instruction value $\lambda 1t$ and the second wavelength instruction value $\lambda 2t$, and controls the laser oscillator 20 to perform pre-oscillation. In the pre-oscillation, the laser control processor 30 calculates a variety of parameters for wavelength measurement (S5). The pre-oscillation processing will be described later in detail with reference to FIGS. 11 to 14.

In S3, the laser control processor 30 controls the laser oscillator 20 to cause it to perform tuning oscillation while switching the target wavelength from the value corresponding to the first wavelength instruction value $\lambda 1t$ to the value corresponding to the second wavelength instruction value $\lambda 2t$ and vice versa. In the tuning oscillation, the laser control processor 30 sets driven amounts D1 and D2, over which the rotary stage 14*e* is driven when the target wavelength is switched from one to the other, based on driven amounts $D1_i$ and $D2_i$, over which the rotary stage 14*e* is driven, and the measured wavelength $\lambda m$ having been measured. The tuning oscillation processing will be described later in detail with reference to FIG. 16. In the case of the laser oscillation at one wavelength, the process in S3 may not be carried out.

In S4, the laser control processor 30 notifies the exposure control processor 110 of the end of pre-oscillation and the tuning oscillation, and controls the laser oscillator 20 to cause it to start the laser oscillation for the exposure operation. In the exposure operation, the laser oscillation is performed while the target wavelength is switched from the value corresponding to the first wavelength instruction value $\lambda 1t$ to the value corresponding to the second wavelength instruction value $\lambda 2t$ and vice versa.

In S5, the laser control processor 30 reads the data on the coarse etalon spectrometer 18 and the fine etalon spectrometer 19, performs the wavelength measurement, and calculates the measured wavelength $\lambda m$. The wavelength measurement processing will be described later in detail with reference to FIGS. 17 to 19.

In S6, the laser control processor 30 controls the rotary stage 14*e* in such a way that the measured wavelength $\lambda m$ approaches the target wavelength.

In S7, the laser control processor 30 evaluates whether information on changes in the first wavelength instruction value $\lambda 1t$ and the second wavelength instruction value $\lambda 2t$ has been received from the exposure control processor 110. When the laser control processor 30 has received the information on changes in the first wavelength instruction value $\lambda 1t$ and the second wavelength instruction value $\lambda 2t$ (YES in S7), the laser control processor 30 returns to the process in S2. When the laser control processor 30 has not received the information on changes in the first wavelength instruction value $\lambda 1t$ and the second wavelength instruction value $\lambda 2t$ (NO in S7), the laser control processor 30 proceeds to the process in S8.

In S8, the laser control processor 30 evaluates whether the semiconductor wafer should be replaced. When the semiconductor wafer should be replaced (YES in S8), the laser control processor 30 returns to the process in S2. When the semiconductor wafer should not be replaced (NO in S8), the laser control processor 30 proceeds to the process in S9.

In step S9, the laser control processor 30 evaluates whether the exposure operation should be terminated. When the exposure operation should not be terminated (NO in S9), the laser control processor 30 returns to the process in S5. When the exposure operation should be terminated (YES in S9), the laser control processor 30 terminates the processes in the present flowchart.

2.3.2 Details of Pre-Oscillation

FIG. 11 is a graph showing an example of the first measured waveform produced by detection of the interference fringes produced by the coarse etalon spectrometer 18 when the pre-oscillation is performed in the embodiment. The horizontal axis of FIG. 11 represents the plurality of channels incorporated in the line sensor 18*d*, and the vertical axis of FIG. 11 represents the amount of light at each of the channels.

In the pre-oscillation, the laser oscillation is performed with the target wavelength set in the vicinity of the wavelength actually used for the exposure. A radius room of an interference fringe produced in the pre-oscillation by the coarse etalon spectrometer 18 is calculated. The center wavelength of the pulse laser beam calculated from the radius room of the interference fringe is set as the reference wavelength $WL_{C0}$. The first measurement range is set to have a fixed width based on the peak positions of the interference fringe produced by the coarse etalon spectrometer 18.

FIG. 12 is a graph showing an example of the second measured waveform produced by detection of the interference fringes produced by the fine etalon spectrometer 19 when the pre-oscillation is performed in the embodiment. The horizontal axis of FIG. 12 represents the plurality of channels incorporated in the line sensor 19*d*, and the vertical axis of FIG. 12 represents the amount of light at each of the channels.

In the pre-oscillation, a radius $r_{f0m}$ of a first interference fringe and a radius $r_{f0m+1}$ of a second interference fringe produced by the fine etalon spectrometer 19 are calculated. The second interference fringe is an interference fringe having an order smaller by one than the order of the first interference fringe.

The radii $r_{c0m}$, $r_{f0m}$, and $r_{f0m-1}$ of the interference fringes correspond to the distances from a center ctr of the interference fringes to the peak positions of the interference fringes.

FIG. 13 shows an example of a method for calculating the radius of an interference fringe. Let Imax be the largest amount of light at a single interference fringe. Let r out be the distance from the center ctr of the interference fringe to the position where the light intensity is a half value Imax/2 at the outer contour of the interference fringe, and let $r_{in}$ be the distance from the center ctr to the position where the light intensity is the half value Imax/2 at the inner contour of the interference fringe. The square ($r^2$) of the radius r of the interference fringe is calculated by Expression 2 below.

$$r^2=(r_{out}^2+r_{in}^2)/2 \qquad \text{Expression 2}$$

The position corresponding to the distance equal to the radius r from the center ctr of the interference fringe is called in some cases the peak position of the interference fringe.

FIG. 14 is a flowchart showing the pre-oscillation processing in detail in the embodiment. The processes shown in FIG. 14 correspond to the subroutine S2 shown in FIG. 10.

In S201, the laser control processor 30 closes the shutter 26.

In S202, the laser control processor 30 sets the target wavelength in the pre-oscillation at a value between the first wavelength instruction value λ1t and the second wavelength instruction value λ2t. The pre-oscillation target wavelength is preferably set at the average of the first wavelength instruction value λ1t and the second wavelength instruction value λ2t.

In S203, the laser control processor 30 controls the laser oscillator 20 in such a way that the pre-oscillation performed in response to the trigger signal from the exposure control processor 110 starts.

In S204, the laser control processor 30 calculates the square ($r_{c0m}^2$) of the radius room of the interference fringe produced by the coarse etalon spectrometer 18. A method for calculating the square ($r_{c0m}^2$) of the radius room may be the method described with reference to FIG. 13 (see Expression 2). Furthermore, the laser control processor 30 calculates the center wavelength of the pulse laser beam as the reference wavelength $WL_{C0}$ by using the expression below.

$$WL_{C0}=\lambda_{c0}+a \cdot r_{c0m}^2$$

where $\lambda_{c0}$ is the value of the center wavelength λ with the tilt angle θ set at 0, θ being the tilt angle of the pulse laser beam passing through the air gap between the partially reflective mirrors of the etalon 18b in Expression 1, and a is a constant of proportionality unique to the coarse etalon spectrometer 18.

In S205, the laser control processor 30 sets two first measurement ranges of the coarse etalon spectrometer 18 that include the two peak positions of the measured interference fringe (see FIG. 11). For example, the width of 17 channels on opposite sides of each of the peak positions of the interference fringe is set as the first measurement range. Instead, the width of 33 channels on opposite sides of each of the peak positions of the interference fringe is set as the first measurement range.

In S206, the laser control processor 30 calculates the squares ($r_{f0m}^2$ and $r_{f0m-1}^2$) of the radii $r_{f0m}$ and $r_{f0m-1}$ of the interference fringes produced by the fine etalon spectrometer 19. A method for calculating the squares ($r_{f0m}^2$ and $n_{f0m-1}^2$) of the radii no m and $r_{f0m-1}$ may be the method described with reference to FIG. 13 (see Expression 2). Furthermore, the laser control processor 30 calculates the fringe constant $C_f$ of the fine etalon spectrometer 19 by using the expression below.

$$C_f=r_{f0m}^2-r_{f0m-1}^2$$

In S207, the laser control processor 30 calculates the reference order $m_{f0}$ of the interference fringes produced by the fine etalon spectrometer 19 by using the expression below.

$$m_{f0}=r_{f0m}^2/C_f$$

In S208, the laser control processor 30 controls the laser oscillator 20 to cause it to stop the pre-oscillation.

In S209, the laser control processor 30 opens the shutter 26.

After S209, the laser control processor 30 terminates the processes in the present flowchart and returns to the processes shown in FIG. 10.

2.3.3 Details of Tuning Oscillation

Figure 16:
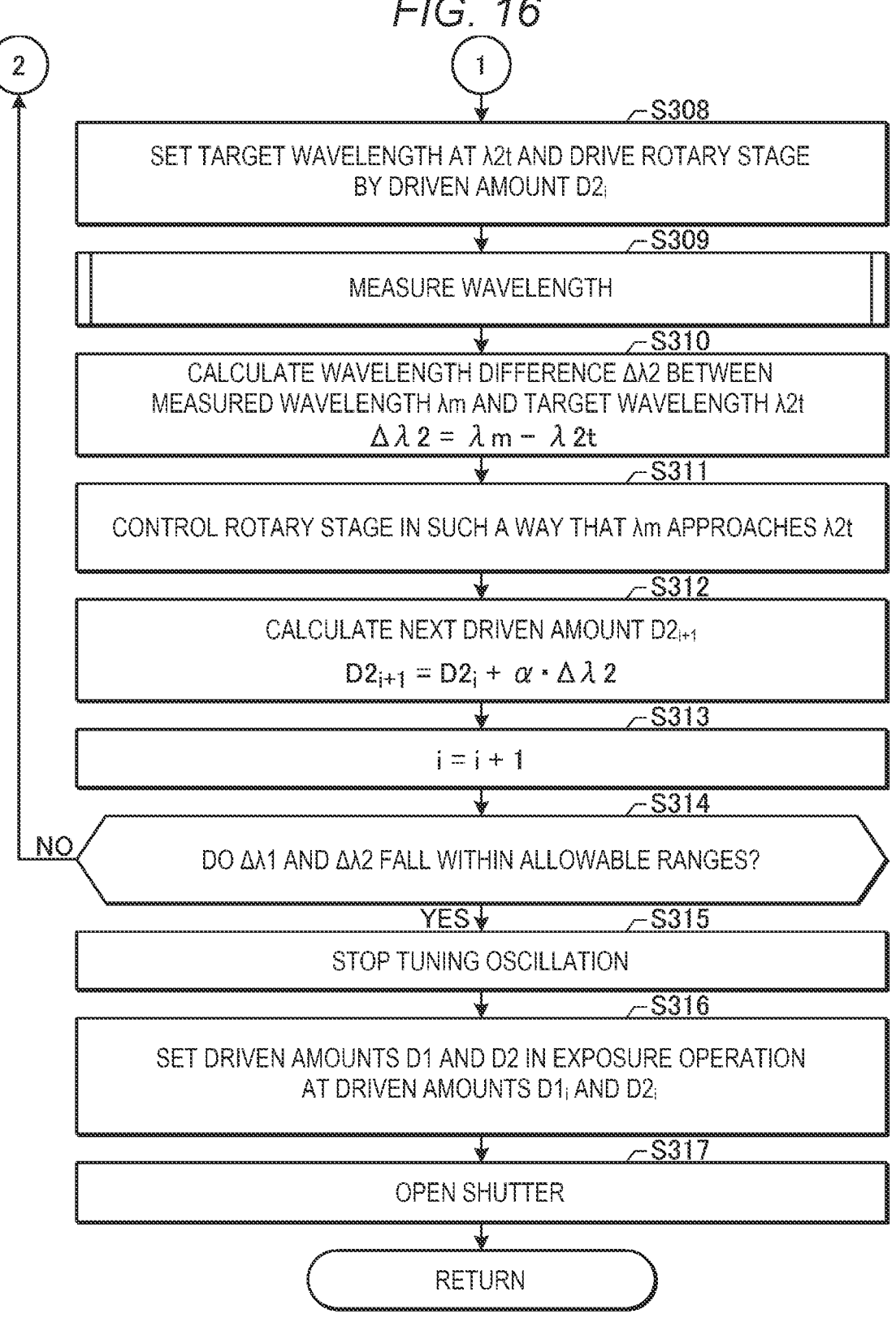
FIG. 16 is a flowchart showing the tuning oscillation processing in detail in the embodiment.

FIGS. 15 and 16 are a flowchart showing the tuning oscillation processing in detail in the embodiment. The processes shown in FIGS. 15 and 16 correspond to the subroutine S3 shown in FIG. 10.

With reference to FIG. 15, in S301, the laser control processor 30 closes the shutter 26.

In S302, the laser control processor 30 controls the laser oscillator 20 to cause it to start the tuning oscillation in response to the trigger signal from the exposure control processor 110.

In S303, the laser control processor 30 sets the target wavelength at the first wavelength instruction value λ1t and drives the rotary stage 14e by the driven amount $D1_i$.

In S304, the laser control processor 30 reads the data on the coarse etalon spectrometer 18 and the fine etalon spectrometer 19, performs the wavelength measurement, and calculates the measured wavelength λm. The wavelength measurement processing will be described later in detail with reference to FIGS. 17 to 19.

In S305, the laser control processor 30 calculates a wavelength difference Δλ1 between the measured wavelength λm and the target wavelength λ1t by using the expression below.

$$\Delta\lambda1=\lambda m-\lambda1t$$

In S306, the laser control processor 30 controls the rotary stage 14e in such a way that the measured wavelength λm approaches the target wavelength λ1 t. In S306, the rotary stage 14e only needs to be controlled, and the intensity and the wavelength of the pulse laser beam may not be measured.

In S307, the laser control processor 30 then uses the expression below to calculate a driven amount over which the rotary stage 14e is driven when the target wavelength is set at λ1 t.

$$D1_{i+1}=D1_i+\alpha\cdot\Delta\lambda1$$

where α is a constant of proportionality unique to the rotary stage 14e.

With reference to FIG. 16, in S308, the laser control processor 30 sets the target wavelength at the second wavelength instruction value λ2t and drives the rotary stage 14e by the driven amount $D2_i$.

In S309, the laser control processor 30 reads the data on the coarse etalon spectrometer 18 and the fine etalon spectrometer 19, performs the wavelength measurement, and calculates the measured wavelength λm. The wavelength measurement processing will be described later in detail with reference to FIGS. 17 to 19.

In S310, the laser control processor 30 calculates a wavelength difference $\Delta\lambda 2$ between the measured wavelength $\lambda m$ and the target wavelength $\lambda 2t$ by using the expression below.

$$\Delta\lambda 2 = \lambda m - \lambda 2t$$

In S311, the laser control processor 30 controls the rotary stage 14e in such a way that the measured wavelength $\lambda m$ approaches the target wavelength $\lambda 2t$. In S311, the rotary stage 14e only needs to be controlled, and the intensity and the wavelength of the pulse laser beam may not be measured.

In S312, the laser control processor 30 then uses the expression below to calculate a driven amount $D2_{i-1}$, over which the rotary stage 14e is driven when the target wavelength is set at $\lambda 2t$.

$$D2_{i+1} = D2_i + \alpha \cdot \Delta\lambda 2$$

In S313, the laser control processor 30 adds one to the value of i to update the value of i. That is, the next driven amounts $D1_{i+1}$ and $D2_{i+1}$ calculated in S307 and S312 are used as the driven amounts $D1_i$ and $D2_i$ when S303 and S308 are next executed.

At S314, the laser control processor 30 evaluates whether the wavelength differences $\Delta\lambda 1$ and $\Delta\lambda 2$ fall within allowable ranges. For example, the laser control processor 30 evaluates whether the absolute value of each of the wavelength differences $\Delta\lambda 1$ and $\Delta\lambda 2$ is smaller than or equal to a predetermined value. When the wavelength differences $\Delta\lambda 1$ and $\Delta\lambda 2$ do not fall within the allowable ranges (NO in S314), the laser control processor 30 returns to the process in S303. When the wavelength differences $\Delta\lambda 1$ and $\Delta\lambda 2$ fall within the allowable ranges (YES in S314), the laser control processor 30 proceeds to the process in S315.

In S315, the laser control processor 30 controls the laser oscillator 20 to cause it to stop the tuning oscillation.

In S316, the laser control processor 30 sets the driven amounts D1 and D2 in the exposure operation at the latest driven amounts $D1_i$ and $D2_i$, respectively.

In S317, the laser control processor 30 opens the shutter 26.

After S317, the laser control processor 30 terminates the processes in the present flowchart and returns to the processes shown in FIG. 10.

2.3.4 Details of Wavelength Measurement

Figure 17:
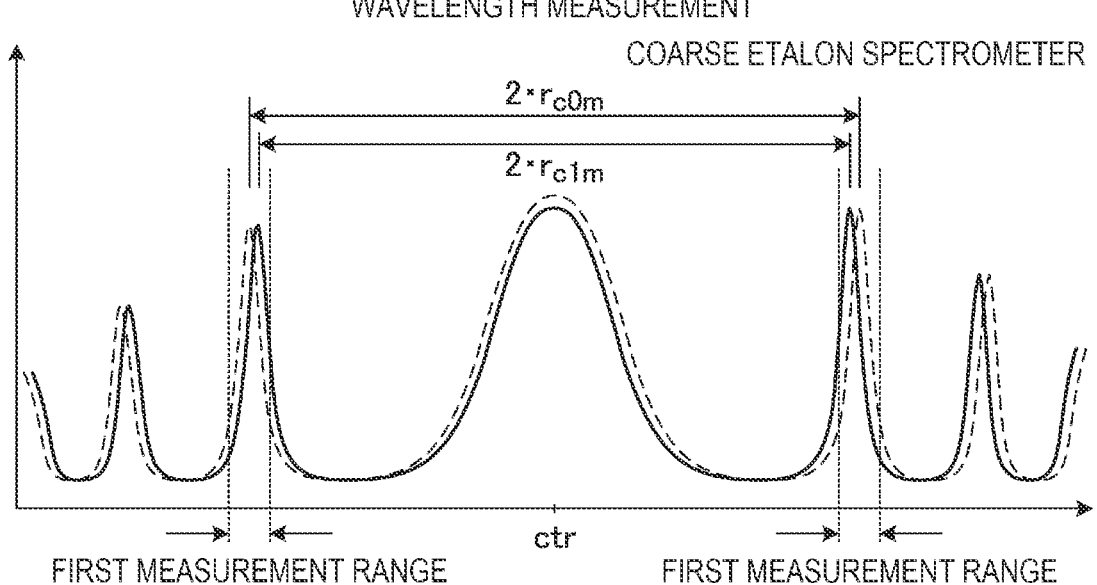
FIG. 17 shows graphs showing an example of the first measured waveform produced by detection of the interference fringes produced by the coarse etalon spectrometer when the wavelength measurement is performed in the embodiment.

FIG. 17 shows graphs showing an example of the first measured waveform produced by detection of the interference fringes produced by the coarse etalon spectrometer 18 when the wavelength measurement is performed in the embodiment. The horizontal axis of FIG. 17 represents the plurality of channels incorporated in the line sensor 18d, and the vertical axis of FIG. 17 represents the amount of light at each of the channels. In FIG. 17, the broken line shows the first measured waveform in the pre-oscillation.

In the wavelength measurement, only data on the first measurement range of the coarse etalon spectrometer 18 that has been set in the pre-oscillation is read. When an interference fringe falls within the first measurement range, a radius ram of the interference fringe produced by the coarse etalon spectrometer 18 in the wavelength measurement can be calculated. A center wavelength $WL_{C1}$ of the pulse laser beam is calculated from the radius ram of the interference fringe. The center wavelength $WL_{C1}$ calculated based on the data on the first measurement range corresponds to the calculated wavelength in the present disclosure. The second measurement range of the fine etalon spectrometer 19 is set based on a first amount of change $\Delta WL_C$, which indicates a change in the center wavelength $WL_{C1}$ with respect to the reference wavelength $WL_{C0}$.

Figure 18:
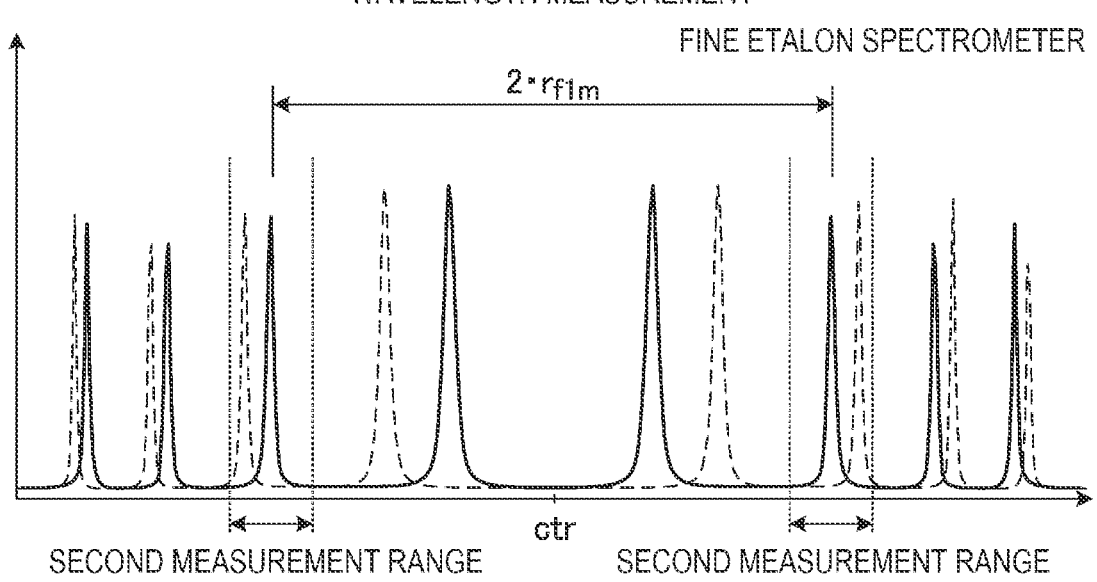
FIG. 18 shows graphs showing an example of the second measured waveform produced by detection of the interference fringes produced by the fine etalon spectrometer when the wavelength measurement is performed in the embodiment.

FIG. 18 shows graphs showing an example of the second measured waveform produced by detection of the interference fringes produced by the fine etalon spectrometer 19 when the wavelength measurement is performed in the embodiment. The horizontal axis of FIG. 18 represents the plurality of channels incorporated in the line sensor 19d, and the vertical axis of FIG. 18 represents the amount of light at each of the channels. In FIG. 18, the broken line shows the second measured waveform in the pre-oscillation.

In the wavelength measurement, only data on the second measurement range of the fine etalon spectrometer 19 is read. When an interference fringe falls within the second measurement range, a radius $r_{f1\,m}$ of the interference fringe produced by the fine etalon spectrometer 19 in the wavelength measurement can be calculated. The center wavelength of the pulse laser beam is calculated as the measured wavelength $\lambda m$ from the radius $r_{f1\,m}$ of the interference fringe.

FIG. 19 is a flowchart showing the wavelength measurement processing in detail in the embodiment. The processes shown in FIG. 19 correspond to the subroutine S5 shown in FIG. 10, the subroutine S304 shown in FIG. 15, and the subroutine S309 shown in FIG. 16.

In S501, the laser control processor 30 reads the data on the first measurement range of the coarse etalon spectrometer 18, and calculates the center wavelength $WL_{C1}$ of the pulse laser beam. A method for calculating the center wavelength $WL_{C1}$ may be the same as the method for calculating the reference wavelength $WL_{C0}$ described with reference to FIG. 14.

In S502, the laser control processor 30 uses the expression below to calculate the first amount of change $\Delta WL_C$, which indicates a change in the center wavelength $WL_{C1}$ with respect to the reference wavelength $WL_{C0}$.

$$\Delta WL_C = WL_{C1} - WL_{C0}$$

In S503, the laser control processor 30 uses the expression below to predict a second amount of change $dm_f$, which indicates a change in the order of an interference fringe produced by the fine etalon spectrometer 19 with respect to a reference order $m_{f0}$.

$$dm_f = \Delta WL_C / \text{FSRf}$$

The laser control processor 30 further uses the expression below to predict an order $m_{f1}$ of an interference fringe produced by the fine etalon spectrometer 19.

$$m_{f1} = m_{f0} + dm_f$$

In S504, the laser control processor 30 uses the expression below to predict a radius $R_{f1\,m}$ of the interference fringe produced by the fine etalon spectrometer 19.

$$R_{f1m} = (m_{f1} \cdot C_f)^{1/2}$$

The laser control processor 30 further uses the expressions below to predict two peak positions $P_{f1l}$ and $P_{f1r}$ of the interference fringe produced by the fine etalon spectrometer 19.

$$P_{f1l} = \text{ctr} - R_{f1m}$$

$$P_{f1r} = \text{ctr} - R_{f1m}$$

In S505, the laser control processor 30 sets two second measurement ranges of the fine etalon spectrometer 19 that include the two predicted peak positions $P_{f1l}$ and $P_{f1r}$. For example, the width of 17 channels on opposite sides of the peak position $P_{f1l}$ of the interference fringe and the width of 17 channels on opposite sides of the peak position $P_{f1r}$ of the interference fringe are set as the second measurement ranges. Alternatively, the width of 33 channels on opposite sides of the peak position $P_{f1l}$ of the interference fringe and the width of 33 channels on opposite sides of the peak position $P_{f1r}$ of the interference fringe are set as the second measurement ranges.

In S506, the laser control processor 30 reads data on the second measurement ranges of the fine etalon spectrometer 19. The laser control processor 30 calculates the square $(r_{f1m}^2)$ of the radius $r_{f1m}$ of the interference fringe produced by the fine etalon spectrometer 19. A method for calculating the square $(r_{f1m}^2)$ of the radius $r_{f1m}$ may be the method described with reference to FIG. 13 (see Expression 2). Furthermore, the laser control processor 30 calculates the center wavelength of the pulse laser beam as the measured wavelength $\lambda m$ by using the expression below.

$$\lambda m = \kappa_{f0} + b \cdot r_{f1m}^2$$

where $\lambda_{f0}$ is the value of the center wavelength $\lambda$ with the tilt angle $\theta$ set at 0, $\theta$ being the tilt angle of the pulse laser beam passing through the air gap between the partially reflective mirrors of the etalon 19b in Expression 1, and b is a constant of proportionality unique to the fine etalon spectrometer 19.

After S506, the laser control processor 30 terminates the processes in the present flowchart and returns to the processes shown in FIG. 10.

2.4 Effects (1) According to the embodiment of the present disclosure, the wavelength measurement apparatus includes the coarse etalon spectrometer 18, the fine etalon spectrometer 19, and the laser control processor 30. The coarse etalon spectrometer 18 has the free spectral range FSRc and generates the first measured waveform from the interference pattern produced by the pulse laser beam. The fine etalon spectrometer 19 has the free spectral range FSRf narrower than the free spectral range FSRc and generates the second measured waveform from the interference pattern produced by the pulse laser beam. The laser control processor 30 reads the data on the first measurement range of the coarse etalon spectrometer 18, sets the second measurement range of the fine etalon spectrometer 19 based on the data on the first measurement range, reads the data on the second measurement range, and calculates the measured wavelength $\lambda m$ of the pulse laser beam based on the data on the first measurement range and the data on the second measurement range.

According to the configuration described above, the second measurement range of the fine etalon spectrometer 19 is set based on the data on the first measurement range, so that the second measurement range out of the measurement range of the fine etalon spectrometer 19 can be properly set, and the wavelength measurement can be accelerated.

(2) According to the embodiment, the first measurement range corresponds to a wavelength range narrower than the free spectral range FSRc of the etalon 18b.

The wavelength measurement can thus be accelerated.

(3) According to the embodiment, the second measurement range corresponds to a wavelength range narrower than the free spectral range FSRf of the etalon 19b.

The wavelength measurement can thus be accelerated.

(4) According to the embodiment, the laser control processor 30 sets the first measurement range based on the first measured waveform generated in the pre-oscillation.

According to the configuration described above, a first measurement range suitable for measurement in the vicinity of the wavelength at which the pre-oscillation is performed can be properly set.

(5) According to the embodiment, the laser control processor 30 sets a range containing the peak position of one of the interference fringes having the first measured waveform generated in the pre-oscillation as the first measurement range.

The first measurement range can thus be properly set.

(6) According to the embodiment, the laser control processor 30 calculates the first amount of change $\Delta WL_C$, which indicates a change in the center wavelength $WL_{C1}$ calculated based on the data on the first measurement range, and sets the second measurement range based on the first amount of change $\Delta WL_C$.

The second measurement range can thus be properly set.

(7) According to the embodiment, the laser control processor 30 calculates the reference wavelength $WL_{C0}$ based on the first measured waveform generated in the pre-oscillation, and calculates a change in the center wavelength $WL_{C1}$ with respect to the reference wavelength $WL_{C0}$ as the first amount of change $\Delta WL_C$.

The first amount of change $\Delta WL_C$ can thus be properly calculated.

(8) According to the embodiment, the laser control processor 30 predicts the second amount of change $dm_f$, which indicates a change in the order $m_{f1}$ of an interference fringe measured by the fine etalon spectrometer 19, based on the first amount of change $\Delta WL_C$, and sets the second measurement range based on the second amount of change $dm_f$.

The second measurement range can thus be properly set.

(9) According to the embodiment, the laser control processor 30 calculates the reference order mm of the interference fringes produced by the fine etalon spectrometer 19 based on the second measured waveform generated in the pre-oscillation, and predicts a change in the order $m_{f1}$ of an interference fringe measured by the fine etalon spectrometer 19 with respect to the reference order mm as the second amount of change $dm_f$.

The second amount of change $dm_f$ can thus be properly predicted.

(10) According to the embodiment, the laser control processor 30 predicts the order $m_{f1}$ of an interference fringe measured by the fine etalon spectrometer 19 based on the first amount of change $\Delta WL_C$, and sets the second measurement range based on the order $m_{f1}$.

The second measurement range can thus be properly set.

(11) According to the embodiment, the laser control processor 30 predicts the radius $R_{f1m}$ of an interference fringe measured by the fine etalon spectrometer 19 based on the first amount of change $\Delta WL_C$, and sets the second measurement range based on the radius $R_{f1m}$.

The second measurement range can thus be properly set.

(12) According to the embodiment, the laser control processor 30 predicts the peak positions $P_{f1l}$ and $P_{f1r}$ of an interference fringe measured by the fine etalon spectrometer 19 based on the first amount of change $\Delta WL_C$, and sets the second measurement range based on the peak positions $P_{f1l}$ and $P_{f1r}$.

The second measurement range can thus be properly set.

(13) According to the embodiment, the narrowed-line laser apparatus 1a includes the laser oscillator 20 configured to output a pulse laser beam, the line narrowing module 14 disposed in the laser oscillator 20, and the rotary stage 14e, which changes the wavelength selected by the line narrowing module 14. The narrowed-line laser apparatus 1a further includes the coarse etalon spectrometer 18, the fine etalon spectrometer 19, and the laser control processor 30. The coarse etalon spectrometer 18 has the free spectral range FSRc and generates the first measured waveform from the interference pattern produced by the pulse laser beam. The fine etalon spectrometer 19 has the free spectral range FSRf narrower than the free spectral range FSRc and generates the second measured waveform from the interference pattern produced by the pulse laser beam. The laser control processor 30 sets the target wavelength based on the first wavelength instruction value λ1t and the second wavelength instruction value λ2t received from the exposure apparatus 100, reads the data on the first measurement range of the coarse etalon spectrometer 18, sets the second measurement range of the fine etalon spectrometer 19 based on the data on the first measurement range, reads the data on the second measurement range, calculates the measured wavelength λm of the pulse laser beam based on the data on the first measurement range and the data on the second measurement range, and controls the rotary stage 14e based on the target wavelength and the measured wavelength λm.

According to the configuration described above, the second measurement range of the fine etalon spectrometer 19 is set based on the data on the first measurement range, so that the second measurement range out of the measurement range of the fine etalon spectrometer 19 can be properly set, and the wavelength measurement can be accelerated.

(14) According to the embodiment, the laser control processor 30 receives the first wavelength instruction value λ1t and the second wavelength instruction value λ2t, which change the target wavelength to a value between the first wavelength and the second wavelength, sets the same first measurement range for the measurement of the first wavelength and for the measurement of the second wavelength, and sets different second measurement ranges for the measurement of the first wavelength and for the measurement of the second wavelength.

According to the configuration described above, setting the same first measurement range for the measurement of the first wavelength and for the measurement of the second wavelength allows measurement of the first wavelength and the second wavelength with the first measurement range fixed.

(15) According to the embodiment, the laser control processor 30 receives the first wavelength instruction value λ1t and the second wavelength instruction value λ2t, which change the target wavelength to a value between the first wavelength and the second wavelength, and the difference between the first wavelength and the second wavelength is smaller than the free spectral range FSRc of the etalon 18b but greater than the free spectral range FSRf of the etalon 19b.

According to the configuration described above, since the difference between the first wavelength and the second wavelength is smaller than the free spectral range FSRc of the etalon 18b, the high-speed wavelength measurement using the wavelength measurement apparatus according to the aforementioned aspect of the present disclosure can be achieved even when the first wavelength is switched to the second wavelength or vice versa with the wavelength difference being greater than the free spectral range FSRf of the etalon 19b.

(16) According to the embodiment, the laser control processor 30 receives the first wavelength instruction value λ1t and the second wavelength instruction value λ2t, which change the target wavelength to a value between the first wavelength and the second wavelength, controls the laser oscillator 20 in such a way that the pre-oscillation is performed at a wavelength between the first and second wavelengths, and sets the first measurement range based on the first measured waveform generated in the pre-oscillation.

According to the configuration described above, the first measurement range can be properly set based on the data on the pre-oscillation at a wavelength between the first wavelength and the second wavelength.

(17) According to the embodiment, the laser control processor 30 receives the first wavelength instruction value λ1t and the second wavelength instruction value λ2t, which change the target wavelength to a value between the first wavelength and the second wavelength, controls the laser oscillator 20 in such a way that the pre-oscillation is performed at a wavelength between the first and second wavelengths, calculates the reference wavelength $WL_{C0}$ based on the first measured waveform generated in the pre-oscillation, calculates the first amount of change $\Delta WL_C$, which indicates a change in the center wavelength $WL_{C1}$ calculated based on the data on the first measurement range with respect to the reference wavelength $WL_{C0}$, and sets the second measurement range based on the first amount of change $\Delta WL_C$.

According to the configuration described above, the second measurement range can be properly set by calculating the reference wavelength $WL_{C0}$ and calculating the first amount of change $\Delta WL_C$ based on the data on the pre-oscillation at a wavelength between the first wavelength and the second wavelength.

(18) According to the embodiment, the laser control processor 30 calculates the reference order mm of the interference fringes produced by the fine etalon spectrometer 19 based on the second measured waveform generated in the pre-oscillation, predicts the second amount of change $dm_f$, which indicates a change in the order $m_{f1}$ of an interference fringe measured by the fine etalon spectrometer 19, with respect to the reference order mm based on the first amount of change $\Delta WL_C$, and sets the second measurement range based on the second amount of change $dm_f$.

According to the configuration described above, the second measurement range can be properly set by calculating the reference order mm and predicting the second amount of change $dm_f$ based on the data on the pre-oscillation at a wavelength between the first wavelength and the second wavelength.

(19) According to the embodiment, the laser control processor 30 receives the first wavelength instruction value λ1t and the second wavelength instruction value λ2t, which change the target wavelength to a value between the first wavelength and the second wavelength, controls the laser oscillator 20 in such a way that the tuning oscillation is performed while switching the target wavelength from the first wavelength to the second wavelength and vice versa, and sets the driven amounts D1 and D2, by which the rotary stage 14e is driven when the target wavelength is switched, based on the driven amounts $D1_i$ and $D2_i$, by which the rotary stage 14e is driven in the tuning oscillation, and the measured wavelength λm.

According to the configuration described above, setting the driven amounts D1 and D2, by which the rotary stage 14e is driven when the target wavelength is switched, allows proper switching of the target wavelength from the first wavelength to the second wavelength and vice versa.

3. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of any thereof and any other than A, B, and C.

What is claimed is:

1. A wavelength measurement apparatus comprising:
a first spectrometer having a first free spectral range and configured to generate a first measured waveform from an interference pattern produced by a pulse laser beam;
a second spectrometer having a second free spectral range narrower than the first free spectral range and configured to generate a second measured waveform from the interference pattern produced by the pulse laser beam; and
a processor configured to read data on a first measurement range of the first spectrometer, calculate a first amount of change indicating a change in a calculated wavelength calculated based on the data on the first measurement range, set a second measurement range of the second spectrometer based on the first amount of change, read data on the second measurement range, and calculate a center wavelength of the pulse laser beam based on the data on the first measurement range and the data on the second measurement range.

2. The wavelength measurement apparatus according to claim 1, wherein the processor is configured to
calculate a reference wavelength based on the first measured waveform generated in pre-oscillation, and
calculate a change in the calculated wavelength with respect to the reference wavelength as the first amount of change.

3. The wavelength measurement apparatus according to claim 1, wherein the processor is configured to
predict a second amount of change indicating a change in an order of an interference fringe measured by the second spectrometer based on the first amount of change, and
set the second measurement range based on the second amount of change.

4. The wavelength measurement apparatus according to claim 3, wherein the processor is configured to
calculate a reference order of interference fringes produced by the second spectrometer based on the second measured waveform generated in pre-oscillation, and
predict a change in the order with respect to the reference order as the second amount of change.

5. The wavelength measurement apparatus according to claim 1, wherein the processor is configured to
predict an order of an interference fringe measured by the second spectrometer based on the first amount of change, and
set the second measurement range based on the order.

6. The wavelength measurement apparatus according to claim 1, wherein the processor is configured to
predict a radius of an interference fringe measured by the second spectrometer based on the first amount of change, and
set the second measurement range based on the radius.

7. The wavelength measurement apparatus according to claim 1, wherein the processor is configured to
predict a peak position of an interference fringe measured by the second spectrometer based on the first amount of change, and
set the second measurement range based on the peak position.

8. A narrowed-line laser apparatus comprising:
a laser oscillator configured to output a pulse laser beam;
a line-narrowing optical system disposed in the laser oscillator;
an actuator configured to change a wavelength selected by the line-narrowing optical system;
a first spectrometer having a first free spectral range and configured to generate a first measured waveform from an interference pattern produced by the pulse laser beam;
a second spectrometer having a second free spectral range narrower than the first free spectral range and configured to generate a second measured waveform from the interference pattern produced by the pulse laser beam; and
a processor configured to set a target wavelength based on a wavelength instruction value received from an external apparatus, read data on a first measurement range of the first spectrometer, the first measurement range corresponding to a first portion of the first measured waveform excluding a second portion of the first measured waveform, set a second measurement range of the second spectrometer based on the data on the first measurement range, the second measurement range corresponding to a first portion of the second measured waveform excluding a second portion of the second measured waveform and corresponding to a wavelength range narrower than the second free spectral range, read data on the second measurement range, calculate a center wavelength of the pulse laser beam based on the data on the first measurement range and the data on the second measurement range, and control the actuator based on the target wavelength and the center wavelength,
wherein the processor is configured to
receive the wavelength instruction value, which changes the target wavelength to a value between a first wavelength and a second wavelength,
control the laser oscillator in such a way that pre-oscillation is performed at a wavelength between the first and second wavelengths,
calculate a reference wavelength based on the first measured waveform generated in the pre-oscillation,
calculate a first amount of change indicating a change in a calculated wavelength calculated based on the data on the first measurement range with respect to the reference wavelength, and
set the second measurement range based on the first amount of change.

9. The narrowed-line laser apparatus according to claim 8, wherein the processor is configured to
calculate a reference order of interference fringes produced by the second spectrometer based on the second measured waveform generated in the pre-oscillation,
predict a second amount of change indicating a change in an order of an interference fringe measured by the second spectrometer with respect to the reference order based on the first amount of change, and
set the second measurement range based on the second amount of change.

* * * * *